US012772716B2

(12) United States Patent
Choi et al.

(10) Patent No.: US 12,772,716 B2
(45) Date of Patent: Oct. 20, 2026

(54) DISPLAY DEVICE

(71) Applicant: Samsung Display Co., Ltd., Yongin-Si (KR)

(72) Inventors: Nakcho Choi, Yongin-si (KR); Yoonsun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 408 days.

(21) Appl. No.: 18/583,629

(22) Filed: Feb. 21, 2024

(65) Prior Publication Data

US 2024/0429345 A1 Dec. 26, 2024

(30) Foreign Application Priority Data

Jun. 26, 2023 (KR) ........................ 10-2023-0081639

(51) Int. Cl.

*H10K 59/80* (2023.01)
*H10H 29/34* (2025.01)
*H10H 29/49* (2025.01)
*H10K 59/35* (2023.01)

(52) U.S. Cl.

CPC ....... *H10K 59/8792* (2023.02); *H10H 29/345* (2025.01); *H10H 29/49* (2025.01); *H10K 59/352* (2023.02); *H10K 59/353* (2023.02)

(58) Field of Classification Search

CPC ............ H10K 59/8792; H10K 59/352; H10K 59/353; H10K 59/122; H10K 59/35; H10K 59/875; H10H 29/345; H10H 29/49

See application file for complete search history.

(56) References Cited

U.S. PATENT DOCUMENTS 7,596,390 B2 * 9/2009 McDonald ........ H04M 1/72448 455/566
7,978,167 B2 * 7/2011 Yabuta ................ G02F 1/13471 345/94
8,213,082 B2 7/2012 Gaides et al.
8,503,122 B2 8/2013 Liu et al.
9,063,284 B2 6/2015 Jones et al.

(Continued)

FOREIGN PATENT DOCUMENTS

JP 2020013695 A * 1/2020
KR 10-2007-0090654 A 9/2007

(Continued)

*Primary Examiner* — Earl N Taylor
(74) *Attorney, Agent, or Firm* — Innovation Counsel LLP

(57) ABSTRACT

A display device includes a substrate including unit pixel areas repeatedly arranged in a plan view, first, second, and third light emitting devices disposed in each of the unit pixel areas on the substrate and emitting light of different colors, a pixel defining layer defining a first pixel opening positioned above a first pixel electrode of the first light emitting device, a second pixel opening positioned above a second pixel electrode of the second light emitting device, and a third pixel opening positioned above a third electrode of the third light emitting device, partition patterns disposed on the first to third light emitting devices and partially covering the first, second, and third pixel openings, and in a plan view, the three pixel openings have the same overlap ratio. An overlap ratio is a ratio of an area of a pixel opening that is covered by the partition patterns to a total area of the pixel opening.

20 Claims, 13 Drawing Sheets

(56) References Cited

U.S. PATENT DOCUMENTS

| | | | | |
|---|---|---|---|---|
| 9,329,311 | B2 | 5/2016 | Halverson et al. | |
| 9,335,449 | B2 | 5/2016 | Gaides et al. | |
| 10,663,630 | B2 | 5/2020 | Larsen et al. | |
| 2005/0215291 | A1 * | 9/2005 | McDonald | H04M 1/72448 455/566 |
| 2009/0165943 | A1 | 7/2009 | Kim | |
| 2016/0116808 | A1 * | 4/2016 | Higano | G02F 1/133512 349/110 |
| 2020/0168844 | A1 * | 5/2020 | Kim | H10K 59/12 |
| 2020/0388663 | A1 * | 12/2020 | Lee | H10K 59/1201 |
| 2021/0255511 | A1 * | 8/2021 | Kuo | G02B 5/003 |
| 2022/0199712 | A1 * | 6/2022 | Park | H10K 59/351 |
| 2022/0231098 | A1 * | 7/2022 | Kim | G02B 26/004 |
| 2023/0081704 | A1 * | 3/2023 | Lee | G02F 1/1323 359/296 |
| 2023/0100884 | A1 * | 3/2023 | Park | G02F 1/1323 359/296 |
| 2024/0237474 | A1 * | 7/2024 | Han | H10K 59/50 |
| 2024/0381749 | A1 * | 11/2024 | Mok | H10K 59/8794 |
| 2025/0133945 | A1 * | 4/2025 | Ying | H10K 59/8792 |
| 2025/0160187 | A1 * | 5/2025 | Song | H10K 71/00 |
| 2025/0248286 | A1 * | 7/2025 | Hwang | H10K 59/40 |
| 2025/0268074 | A1 * | 8/2025 | Chung | H10K 59/40 |
| 2025/0284157 | A1 * | 9/2025 | Park | G02B 5/30 |
| 2026/0114165 | A1 * | 4/2026 | Jin | H10K 59/879 |
| 2026/0123248 | A1 * | 4/2026 | Choi | H10K 59/121 |

FOREIGN PATENT DOCUMENTS

| | | | |
|---|---|---|---|
| KR | 10-2007-0090662 | A | 9/2007 |
| KR | 10-1546554 | B1 | 8/2015 |
| KR | 10-1714807 | B1 | 3/2017 |
| KR | 10-1728177 | B1 | 4/2017 |
| KR | 10-1830969 | B1 | 2/2018 |
| KR | 10-2018-0062176 | A | 6/2018 |
| KR | 10-1979273 | B1 | 5/2019 |
| KR | 10-1983065 | B1 | 5/2019 |
| KR | 10-1985030 | B1 | 5/2019 |
| KR | 10-2020-0063591 | A | 6/2020 |
| KR | 10-2277206 | B1 | 7/2021 |
| KR | 10-2021-0121933 | A | 10/2021 |
| KR | 10-2022-0043779 | A | 4/2022 |
| KR | 10-2414650 | B1 | 6/2022 |

* cited by examiner

DISPLAY DEVICE

This application claims priority to Korean Patent Application No. 10-2023-0081639 filed on Jun. 26, 2023, and all the benefits accruing therefrom under 35 U.S.C. § 119, the content of which in its entirety is herein incorporated by reference.

BACKGROUND

1. Field

The disclosure relates to a display device. More specifically, the disclosure relates to a display device capable of adjusting a viewing angle.

2. Description of the Related Art

Flat panel displays are used as display devices to replace cathode ray tube displays due to their characteristics such as light weight and thinness. A representative example of such a flat panel display device is an organic light emitting display device.

The display device is generally manufactured to have a wide viewing angle, but it may be necessary to temporarily implement a narrow viewing angle so that no one other than the user can see the screen.

SUMMARY

Embodiments provide a display device with excellent lifespan characteristics and an adjustable viewing angle.

A display device according to an embodiment includes a substrate including unit pixel areas repeatedly arranged in a plan view, first, second, and third light emitting devices disposed in each of the unit pixel areas on the substrate and emitting light of different colors, a pixel defining layer defining a first pixel opening positioned above a first pixel electrode of the first light emitting device, a second pixel opening positioned above a second pixel electrode of the second light emitting device, and a third pixel opening positioned above a third electrode of the third light emitting device, partition patterns disposed on the first, second, and third light emitting devices and partially covering the first, second, and third pixel openings, and in a plan view, a first overlap ratio, a second overlap ratio, and a third overlap ratio are equal to one another. The first overlap ratio is a ratio of an area of the first pixel opening that is covered by the partition patterns to a total area of the first pixel opening. The second overlap ratio is a ratio of an area of the second pixel opening that is covered by the partition patterns to a total area of the second pixel opening. The third overlap ratio is a ratio of an area of the third pixel opening that is covered by the partition patterns to a total area of the third pixel opening.

In an embodiment, in a plan view, a first opening ratio, a second opening ratio, and a third opening ratio may be equal to one another. The first opening ratio is a ratio of an area of the first pixel opening that is adjacent to a portion that is covered by the partition patterns to the total area of the first pixel opening. The second opening ratio is a ratio of an area of the second pixel opening that is adjacent to a portion that is covered by the partition patterns to the total area of the second pixel opening. The third opening ratio is a ratio of an area of the third pixel opening that is adjacent to a portion that is covered by the partition patterns to the total area of the third pixel opening.

In an embodiment, the display device may further include fourth to sixth light emitting devices disposed in each of the unit pixel areas and emitting light of different colors, and the partition patterns may be spaced apart from the fourth to sixth light emitting devices in a plan view.

In an embodiment, in a wide viewing angle mode, the first, second, and third light emitting devices may be configured to selectively emit light, and the fourth to sixth light emitting devices may be configured to emit light. In a narrow viewing angle mode, the first, second, and third light emitting devices may be configured to emit light, and light emission of the fourth, fifth, and sixth light emitting devices may be configured to remain turned off.

In an embodiment, the pixel defining layer further may further define a fourth pixel opening positioned above a fourth pixel electrode of the fourth light emitting device, a fifth pixel opening positioned above a fifth pixel electrode of the fifth light emitting device, and a sixth pixel opening positioned above a sixth pixel electrode of the sixth light emitting device.

In an embodiment, the first light emitting device and the fourth light emitting device may emit light of the same color, the second light emitting device and the fifth light emitting device may emit light of the same color, and the third light emitting device and the sixth light emitting device may emit light of the same color.

In an embodiment, in a plan view, the total area of the first pixel opening and a total area of the fourth pixel opening may be different from each other.

In an embodiment, in a plan view, the total area of the first pixel opening may be larger than the total area of the fourth pixel opening.

In an embodiment, in a plan view, the total area of the second pixel opening and a total area of the fifth pixel opening may be equal to each other, and the total area of the third pixel opening and a total area of the sixth pixel opening may be equal to each other.

In an embodiment, in a plan view, the total area of the second pixel opening and a total area of the fifth pixel opening may be different from each other, and the total area of the third pixel opening and a total area of the sixth pixel opening may be equal to each other.

In an embodiment, in a plan view, the total area of the second pixel opening and a total area of the fifth pixel opening may be different from each other, and the total area of the third pixel opening and a total area of the sixth pixel opening may be different from each other.

In an embodiment, the partition patterns may include at least one of black pigment, black dye, and molybdenum-tantalum oxide (MTO).

In an embodiment, the display device may further include a light transmission layer disposed between the partition patterns.

In an embodiment, each of the partition patterns may extend in a first direction and be spaced apart from one another along a second direction intersecting the first direction.

A display device according to an embodiment includes a substrate including unit pixel areas repeatedly arranged in a plan view, light emitting devices disposed in each of the unit pixel areas on the substrate and emitting light of different colors, a pixel defining layer defining pixel openings, each of the pixel openings positioned above a pixel electrode of each of the light emitting devices, partition patterns disposed on the light emitting devices and partially covering the pixel openings in a plan view, wherein the pixel openings have the same overlap ratio. The overlap ratio is a ratio of an area of a pixel opening that is covered by the partition patterns to a total area of the pixel opening.

In an embodiment, the pixel openings may have the same opening ratio. The opening ratio may be a ratio of an area of a pixel opening that is adjacent to a portion that is covered by the partition patterns to a total area of the pixel opening.

In an embodiment, in a wide viewing angle mode, the light emitting devices may be configured to selectively emit light, and in a narrow viewing angle mode, the light emitting devices may be configured to emit light.

In an embodiment, the partition patterns may include at least one of black pigment, black dye, and molybdenum-tantalum oxide (MTO).

In an embodiment, the display device may further include a light transmission layer disposed between the partition patterns.

In an embodiment, each of the partition patterns may extend in a first direction and be spaced apart from one another along a second direction intersecting the first direction.

In the display device according to some embodiments, the display device may include the partition patterns disposed on light emitting devices to be divided into a wide viewing angle mode and a narrow viewing angle mode.

In addition, the display device may have a structure in which a total area of each of pixel openings defined in each of unit pixel areas and corresponding to the light emitting devices that emit the same color is different. Accordingly, the pixel openings overlapping the partition patterns may all have the same effective aperture ratio.

That is, even when the display device includes the partition patterns for adjusting the viewing angle, depending on a planar shape of each of the pixel openings and/or the color of light emitted by the corresponding light emitting device, a deviation in effective aperture ratio may not occur between the pixel openings overlapping the partition patterns. Accordingly, the luminous efficiency of the light emitting devices overlapping the partition patterns may be substantially the same. Accordingly, lifespan characteristics of light emitting devices overlapping with the partition patterns may be improved.

It is to be understood that both the foregoing general description and the following detailed description are exemplary and explanatory and are intended to provide further explanation of the disclosure as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
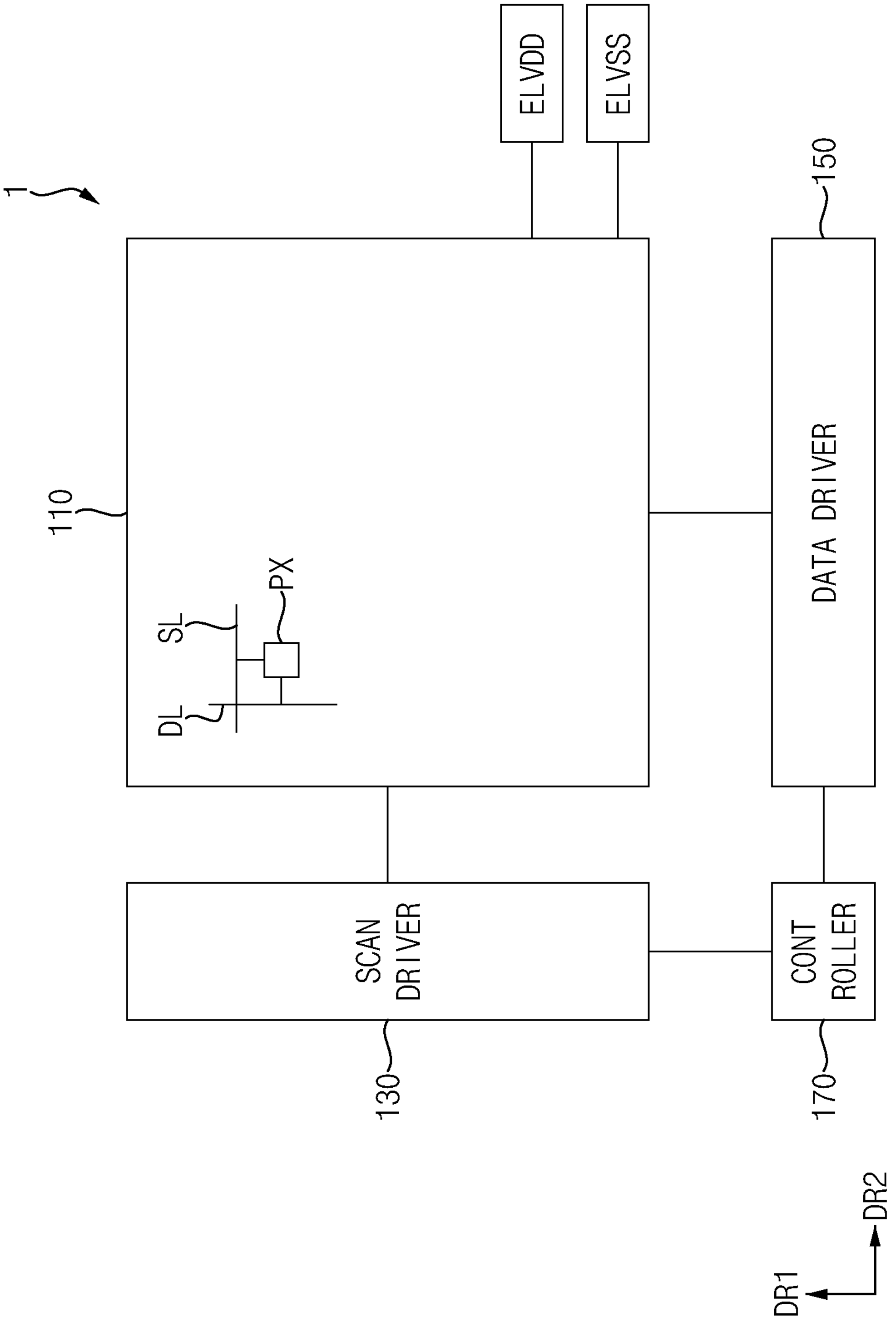
FIG. 1 is a block diagram illustrating a display device according to an embodiment.

The inventive concept now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

FIG. 1 is a block diagram illustrating a display device according to an embodiment.

Referring to FIG. 1, the display device 1 may include a display part 110, a scan driver 130, a data driver 150, and a controller 170.

The display part 110 may have pixels PX and signal lines capable of applying electrical signals to the pixels PX.

Pixels PX may be arranged in a matrix form. For example, the pixels PX may be arranged in a first direction DR1 and a second direction DR2. The signal lines may include data lines DL extending in the first direction DR1 and scan lines SL extending in the second direction DR2. The scan lines SL may be arranged to be spaced apart along the first direction DR1 and transmit scan signals to the pixels PX. The data lines DL may be arranged to be spaced apart along the second direction DR2 and transmit the data lines to the pixels PX. In an embodiment, each of the pixels PX may be connected to at least one corresponding scan line among the scan lines SL and at least one corresponding data line among the data lines DL.

A first power voltage ELVDD and a second power voltage ELVSS may be supplied to the pixels PX in the display part 110. The first power voltage ELVDD may be a high level voltage provided to a first electrode (pixel electrode or anode) of a light emitting device included in each of the pixels PX. The second power voltage ELVSS may be a low level voltage provided to a second electrode (opposite electrode or cathode) of the light emitting device included in each of the pixels PX. The first power voltage ELVDD and the second power voltage ELVSS may be driving voltages for causing the pixels PX to emit light.

The signal lines include scan lines and data lines. The scan driver 130 may be connected to the scan lines SL, generate a scan signal in response to a scan control signal provided from the controller 170, and sequentially supply the scan signal to the scan lines SL.

The data driver 150 may be connected to the data lines DL and supply a data signal to the data lines DL in response to a data control signal from the controller 170.

Hereinafter, a display device according to an embodiment of the present disclosure will be described by taking an organic light emitting display device as an example, but the display device of the present disclosure is not limited thereto. As another example, the display device of the present disclosure may be an inorganic light emitting display, a quantum dot light emitting display, or the like.

Figure 2:
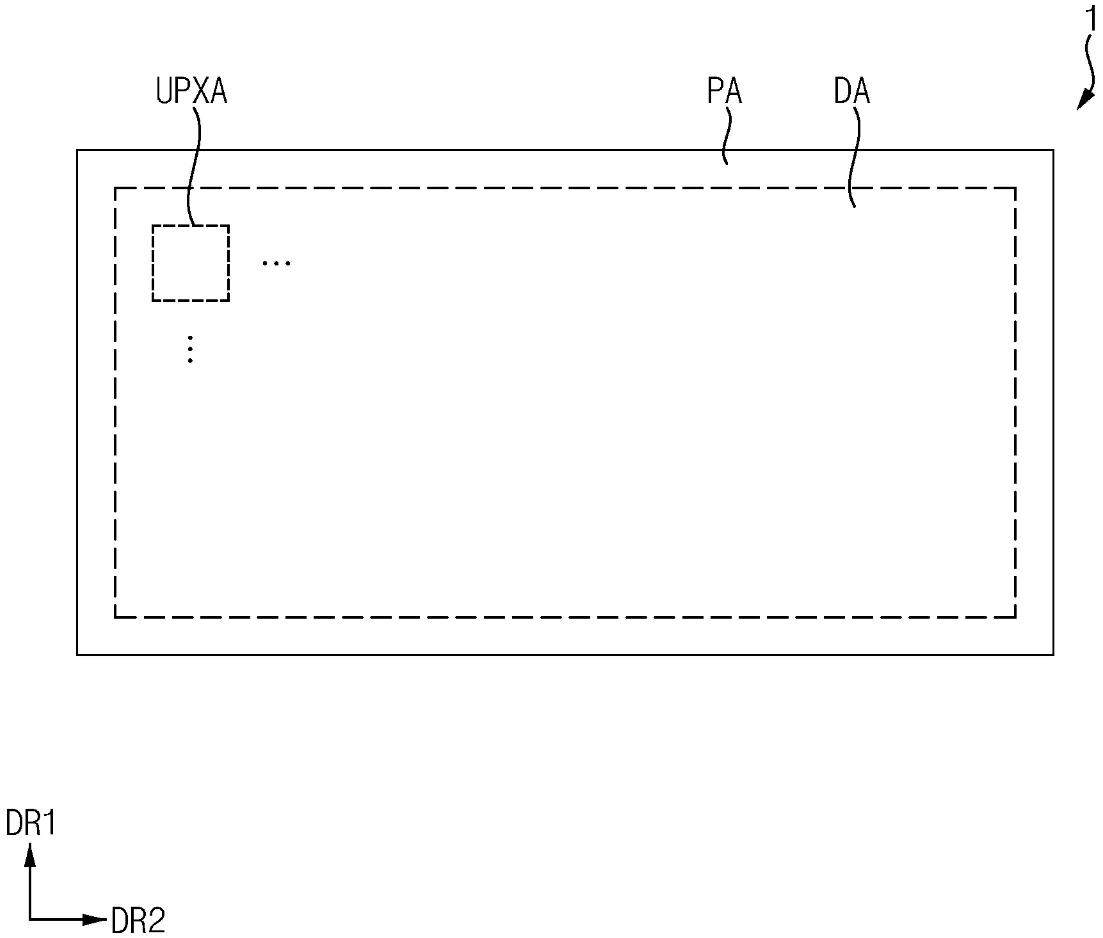
FIG. 2 is a plan view illustrating the display device of FIG. 1.

FIG. 2 is a plan view illustrating the display device of FIG. 1.

Referring further to FIG. 2, the display device 1 may be divided into a display area DA and a peripheral area PA. The display area DA may display an image. The peripheral area PA may be a non-display area that does not display an image.

However, the present disclosure is not necessarily limited to this, and in another example, the peripheral area PA may also display an image.

The display area DA may be entirely surrounded by the peripheral area PA. Various components constituting the display device 1 may be disposed on a substrate (SUB, in FIG. 5). Accordingly, the substrate SUB may be interpreted as including the display area DA and the peripheral area PA.

The display device 1 (e.g., the substrate SUB) may include unit pixel areas UPXA disposed in the display area DA. For example, the unit pixel areas UPXA may be repeatedly arranged along the first direction DR1 and the second direction DR2. At this time, each of the unit pixel areas UPXA is a division of a repetitive shape and does not mean a disconnection in the structure.

At least two or more pixels PX may be disposed in each of the unit pixel areas UPXA. In other words, at least two or more light emitting devices may be disposed in each of the unit pixel areas UPXA. Accordingly, each of the unit pixel areas UPXA may emit light of a color obtained by combining light emitted by the light emitting devices. An arrangement of the pixels PX in each of the unit pixel areas UPXA may be the same for each unit pixel area UPXA.

In an embodiment, two light emitting devices that emit light of a first color, two light emitting devices that emit light of a second color, and two light emitting devices that emit light of a third color may be disposed in each of the unit pixel areas UPXA. That is, a total of six light emitting devices may be disposed in each of the unit pixel areas UPXA. In an embodiment, the first color may be red, the second color may be green, and the third color may be blue. However, the present disclosure is not necessarily limited thereto, and the number of light emitting devices arranged in each of the unit pixel areas UPXA and color of light emitted by the light emitting devices may vary depending on embodiments. A specific structure of each of the unit pixel areas UPXA will be described in more detail later with reference to FIGS. 3 and 5.

A driving circuit part for driving the pixels PX, for example, the scan driver 130, the data driver 150, and the controller 170 illustrated in FIG. 1, may be disposed in the peripheral area PA.

Figure 3:
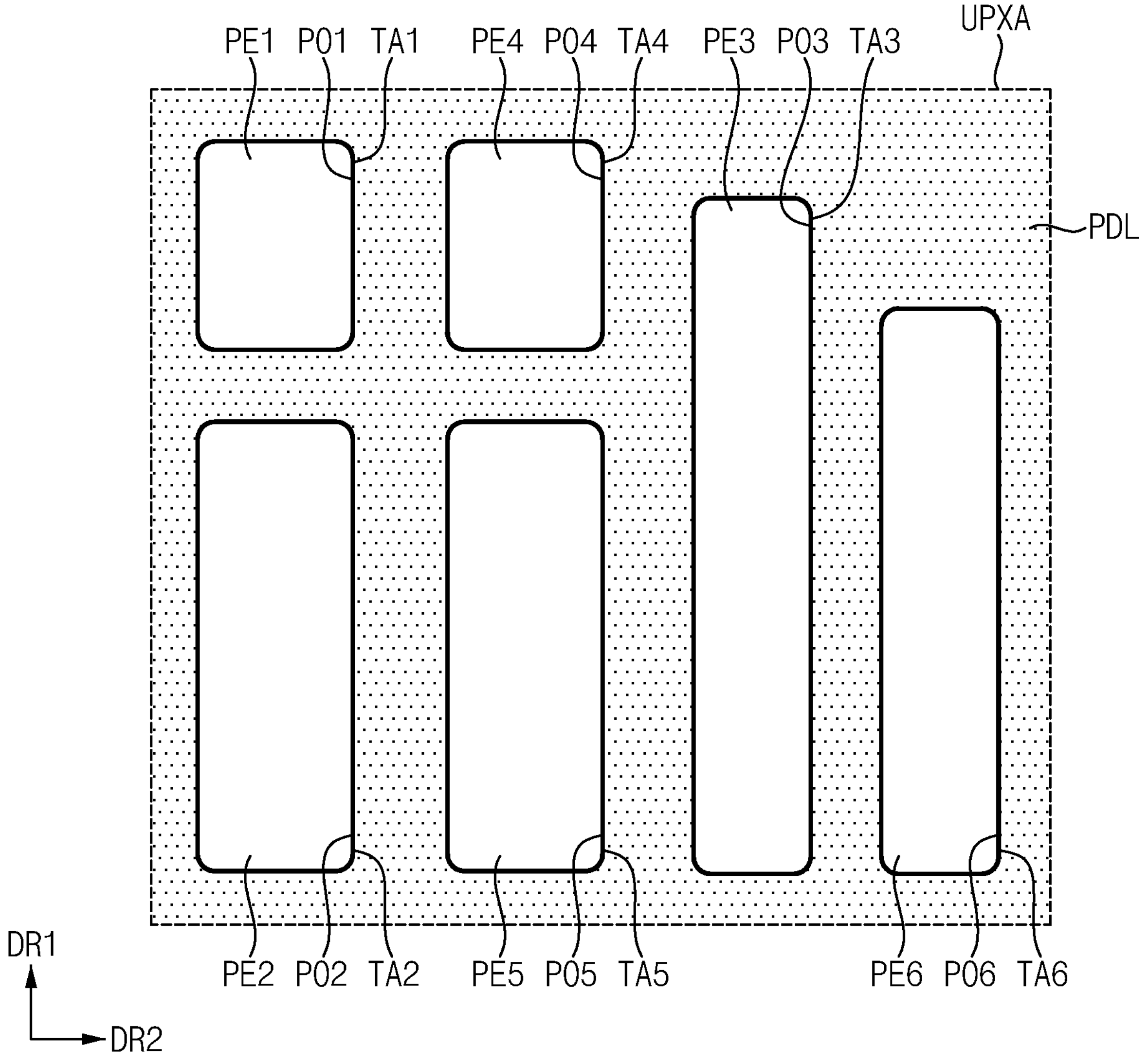
FIGS. 3 and 4 are plan views schematically illustrating a unit pixel area of the display device of FIG. 2 according to an embodiment.
Figure 4:
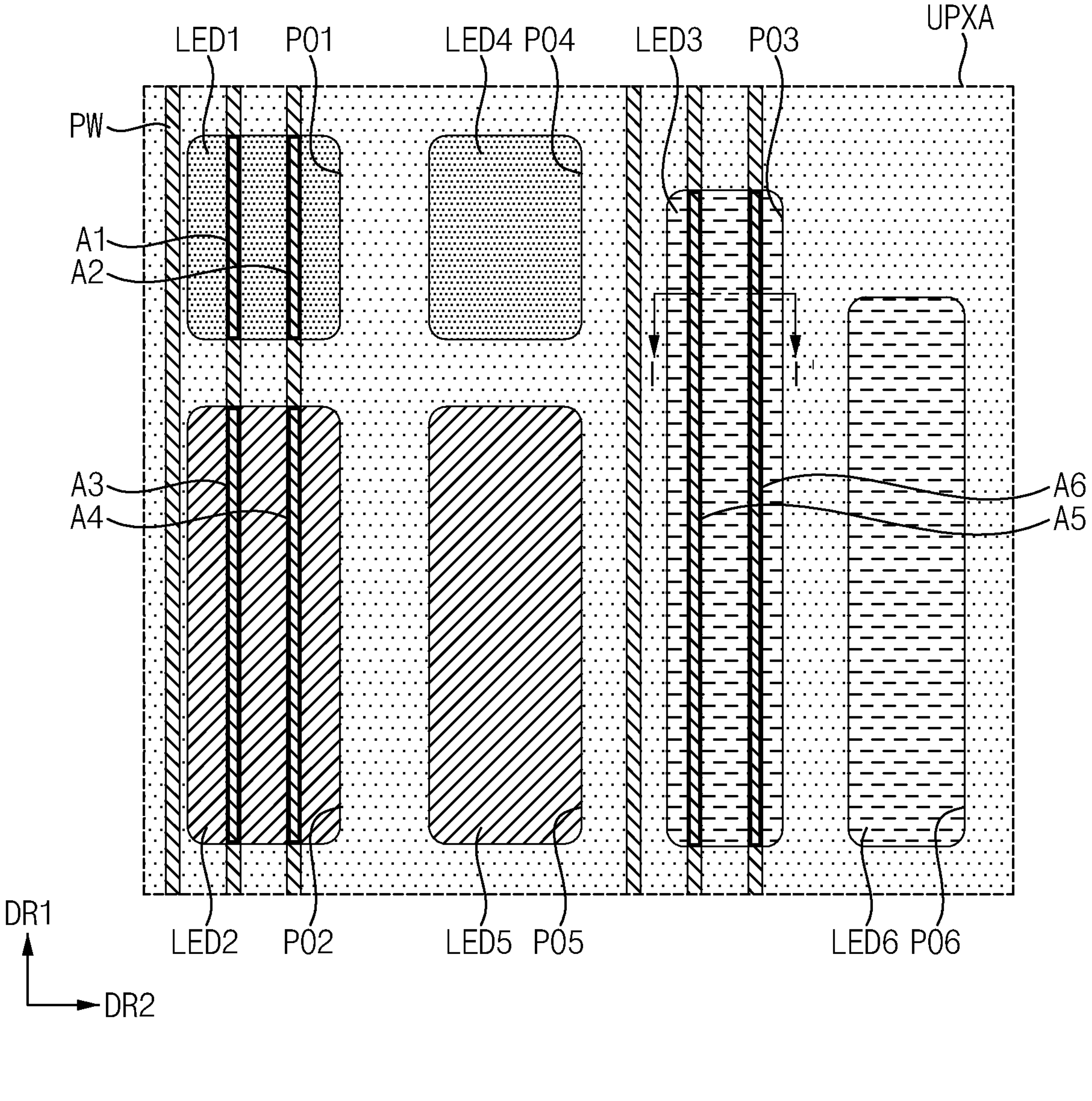

FIGS. 3 and 4 are plan views schematically illustrating a unit pixel area of the display device of FIG. 2 according to an embodiment. For example, FIG. 3 is a plan view schematically illustrating an arrangement of a pixel electrode and a pixel defining layer of the display device of FIG. 2 according to an embodiment, and FIG. 4 is a plan view schematically illustrating an arrangement of light emitting devices and partition patterns of the display device of FIG. 2 according to an embodiment.

Figure 5:
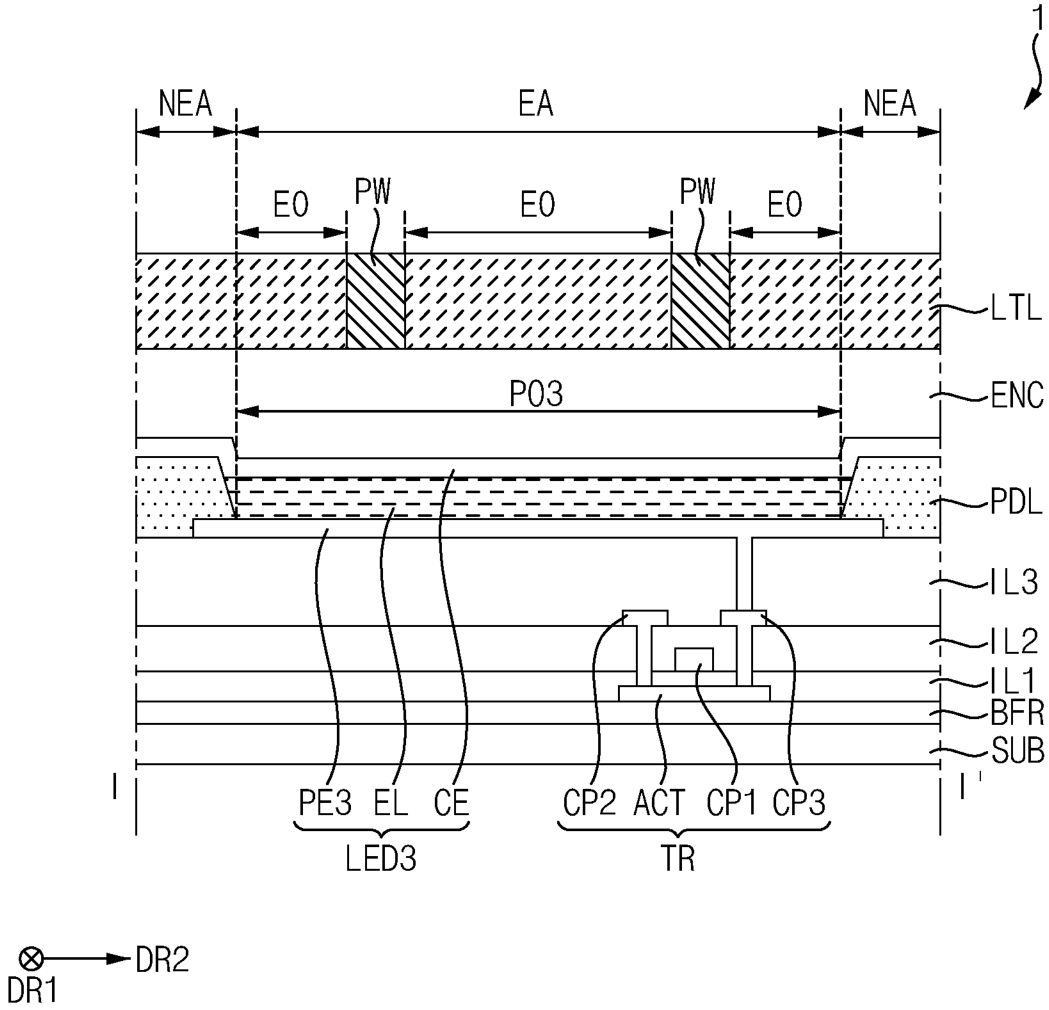
FIG. 5 is a cross-sectional view taken along line I-I' of FIG. 4.

FIG. 5 is a cross-sectional view taken along line I-I' of FIG. 4. For example, FIG. 5 illustrates a light emitting area EA corresponding to a third light emitting device LED3 of FIG. 4. Meanwhile, a cross-sectional structure of a first light emitting device LED1, a cross-sectional structure of a second light emitting device LED2, a cross-sectional structure of a fourth light emitting device LED4, a cross-sectional structure of a fifth light emitting device LED5, and cross-sectional structure of the sixth light emitting device LED6 in FIG. 4 may be substantially the same as the cross-sectional structure of the third light emitting device LED3 illustrated in FIG. 5.

First, referring to FIGS. 4 and 5, the display device 1 may include a substrate SUB, a buffer layer BFR, first to third insulating layers IL1, IL2, and IL3, an active pattern ACT, first to third conductive patterns CP1, CP2, and CP3, a pixel defining layer PDL, first to sixth light emitting devices LED1, LED2, LED3, LED4, LED5, and LED6, encapsulation layer ENC, light transmission layer LTL, and partition patterns PW. The active pattern ACT and the first to third conductive patterns CP1, CP2, and CP3 may form a transistor TR. Each of the first to sixth light emitting devices LED1, LED2, LED3, LED4, LED5, and LED6 may include a pixel electrode, a light emitting layer EL, and a common electrode CE.

The substrate SUB may include a transparent or opaque material. In an embodiment, examples of materials that can be used as a substrate SUB may include glass, quartz, plastic, or the like. These may be used alone or in combination with each other.

The buffer layer BFR may be disposed on the substrate SUB. The buffer layer BFR may prevent impurities such as oxygen and moisture from diffusing into an upper portion of the substrate SUB. The buffer layer BFR may include an inorganic insulating material such as a silicon compound or metal oxide.

The active pattern ACT may be disposed on the buffer layer BFR. In an embodiment, the active pattern ACT may include a silicon semiconductor material or an oxide semiconductor material.

In an embodiment, the first insulating layer IL1 may be disposed on the buffer layer BFR. The first insulating layer IL1 may cover the active pattern ACT. In an embodiment, the first insulating layer IL1 may be arranged in a pattern on the active pattern ACT to expose a portion of the active pattern ACT. For example, the first insulating layer IL1 may be arranged in a pattern on the active pattern ACT so as to overlap the first conductive pattern CP1. The first insulating layer IL1 may include an inorganic insulating material.

The first conductive pattern CP1 may be disposed on the first insulating layer IL1. In an embodiment, the first conductive pattern CP1 may include metal, alloy, conductive metal oxide, transparent conductive material, or the like.

The second insulating layer IL2 may be disposed on the first insulating layer IL1. In an embodiment, the second insulating layer IL2 may cover the first conductive pattern CP1. The second insulating layer IL2 may include an inorganic insulating material.

The second conductive pattern CP2 and the third conductive pattern CP3 may be disposed on the second insulating layer IL2. The second conductive pattern CP2 and the third conductive pattern CP3 may be electrically connected to the active pattern ACT through a contact hole formed in the second insulating layer IL2. Each of the second conductive pattern CP2 and the third conductive pattern CP3 may include a metal, an alloy, a conductive metal oxide, a transparent conductive material, or the like.

The third insulating layer IL3 may be disposed on the second insulating layer IL2. The third insulating layer IL3 may cover the second conductive pattern CP2 and the third conductive pattern CP3. The third insulating layer IL3 may include an organic insulating material.

Meanwhile, a configuration, an arrangement, and a connection structure of the transistor TR and the plurality of insulating layers IL1, IL2, and IL3 illustrated in FIG. 5 are only an example and may be changed in various ways.

Referring further to FIG. 3, the pixel electrodes PE1, PE2, PE3, PE4, PE5, and PE6 may be disposed on the third insulating layer IL3. Each of the pixel electrodes PE1, PE2, PE3, PE4, PE5, and PE6 may be electrically connected to the transistor TR through contact holes formed in the third insulating layer IL3. In an embodiment, the pixel electrodes PE1, PE2, PE3, PE4, PE5, and PE6 may include metal, alloy, conductive metal oxide, transparent conductive material, or the like.

The pixel electrodes PE1, PE2, PE3, PE4, PE5, and PE6 may be disposed in each of the unit display areas UPXA on the third insulating layer IL3. The pixel electrodes PE1, PE2, PE3, PE4, PE5, and PE6 may be arranged to be spaced apart from each other.

The pixel defining layer PDL may be disposed on the third insulating layer IL3 and the pixel electrodes PE1, PE2, PE3, PE4, PE5, and PE6. The pixel defining layer PDL may include an organic insulating material. In an embodiment, the pixel defining layer PDL may further include a light blocking material. Examples of the light blocking material of the pixel defining layer PDL may include black pigment, black dye, or the like.

The pixel defining layer PDL may cover edges of each of the pixel electrodes PE1, PE2, PE3, PE4, PE5, and PE6 in each of the unit display areas UPXA, and expose a portion of each of the pixel electrodes PE1, PE2, PE3, PE4, PE5, and PE6.

Specifically, the pixel defining layer PDL may define a first pixel opening PO1 exposing a portion of the first pixel electrode PE1, a second pixel opening PO2 exposing a portion of the second pixel electrode PE2, a third pixel opening PO3 exposing a portion of the third pixel electrode PE3, a fourth pixel opening PO4 exposing a portion of the fourth pixel electrode PE4, a fifth pixel opening PO5 exposing a portion of the fifth pixel electrode PE5, and a sixth pixel opening PO6 exposing a portion of the sixth pixel electrode PE6.

In an embodiment, an arrangement structure of the first to sixth pixel openings PO1, PO2, PO3, PO4, PO5, and PO6 defined in each of the unit pixel areas UPXA may be an S-stripe structure. For example, the first pixel opening PO1 and the second pixel opening PO2 may be disposed in a first column, the fourth pixel opening PO4 and the fifth pixel opening PO5 may be disposed in a second column adjacent to the first column, the third pixel opening PO3 may be disposed in a third column adjacent to the second column, and the sixth pixel opening PO6 may be disposed in a fourth column adjacent to the third column.

That is, in a plan view, the first pixel opening PO1 and the fourth pixel opening PO4 may be arranged adjacent to each other so that their long sides face each other, the second pixel opening PO2 and the fifth pixel opening PO5 may be arranged adjacent to each other so that their long sides face each other, and the third pixel opening PO3 and the sixth pixel opening PO6 may be arranged adjacently so that their long sides face each other. Additionally, long sides of each of the fourth pixel opening PO4 and the fifth pixel opening PO5 may be arranged to face the long side of the third pixel opening PO3. However, the present disclosure is not necessarily limited thereto, and a planar arrangement of the first to sixth pixel openings PO1, PO2, PO3, PO4, PO5, and PO6 may be variously changed depending on embodiments.

In an embodiment, in a plan view, a total area TA1 of the first pixel opening PO1 may be substantially equal to a total area TA4 of the fourth pixel opening PO4, and a total area TA2 of the second pixel opening PO2 may be substantially equal to a total area TA5 of the fifth pixel opening PO5. In other words, an aperture ratio of the first pixel opening PO1 may be substantially equal to an aperture ratio of the fourth pixel opening PO4, and an aperture ratio of the second pixel opening PO2 may be substantially equal to an aperture ratio of the fifth pixel opening PO5. However, the present disclosure is not necessarily limited thereto.

In an embodiment, a length of the long side of the first pixel opening PO1 and a length of the long side of the fourth pixel opening PO4 may be substantially the same, and a length of a short side of the first pixel opening PO1 and a length of a short side the fourth pixel opening PO4 may be substantially the same. Accordingly, the total area TA1 of the first pixel opening PO1 may be substantially equal to the total area TA4 of the fourth pixel opening PO4. However, the present disclosure is not necessarily limited thereto, and if the total area TA1 of the first pixel opening PO1 and the total area TA4 of the fourth pixel opening PO4 are the same, a planar shape of the first pixel opening PO1 and a planar shape of the fourth pixel opening PO4 may be changed in various ways.

In addition, a length of the long side of the second pixel opening PO2 and a length of the long side of the fifth pixel opening PO5 may be substantially the same, and a length of a short side of the second pixel opening PO2 and a length of a short side the fifth pixel opening PO5 may be substantially the same. Accordingly, the total area TA2 of the second pixel opening PO2 may be substantially equal to the total area TA5 of the fifth pixel opening PO5. However, the present disclosure is not necessarily limited thereto, and if the total area TA2 of the second pixel opening PO2 and the total area TA5 of the fifth pixel opening PO5 are the same, a planar shape of the second pixel opening PO2 and a planar shape of the fifth pixel opening PO5 may be changed in various ways.

In an embodiment, in a plan view, a total area TA3 of the third pixel opening PO3 and a total area TA6 of the sixth pixel opening PO6 may be different from each other. In other words, an aperture ratio of the third pixel opening PO3 and an aperture ratio of the sixth pixel opening PO6 may be different from each other.

For example, the total area TA3 of the third pixel opening PO3 may be larger than the total area TA6 of the sixth pixel opening PO6. In other words, the aperture ratio of the third pixel opening PO3 may be larger than the aperture ratio of the sixth pixel opening PO6.

In an embodiment, the long side of the third pixel opening PO3 may be defined to be longer than the long side of the sixth pixel opening PO6 in the first direction DR1. That is, the third pixel opening PO3 may be defined to be longer in the first direction DR1 than the sixth pixel opening PO6. Additionally, a length of a short side of the third pixel opening PO3 and a length of a short side of the sixth pixel opening PO6 may be substantially the same. Accordingly, the total area TA3 of the third pixel opening PO3 may be larger than the total area TA6 of the sixth pixel opening PO6. However, the present disclosure is not necessarily limited thereto, and if the total area TA3 of the third pixel opening PO3 is larger than the total area TA6 of the sixth pixel opening PO6, a planar shape of the third pixel opening PO3 and a planar shape of the sixth pixel opening PO6 may be changed in various ways.

The light emitting area EA may be defined by the first to sixth pixel openings PO1, PO2, PO3, PO4, PO5, and PO6 of the pixel defining layer PDL. That is, the pixel defining layer PDL may be disposed in a non-light emitting area NEA surrounding the light emitting area EA. In other words, the pixel defining layer PDL may have a grid shape in a plan view.

The light emitting layer EL may be disposed in the first to sixth pixel openings PO1, PO2, PO3, PO4, PO5, and PO6 of the pixel defining layer PDL.

In an embodiment, the light emitting layer EL may include a material that emits light. For example, the light emitting layer EL may include an organic light emitting material. In an embodiment, the light emitting layer EL of the first light emitting device LED1 and the light emitting layer EL of the fourth light emitting device LED4 may include a material capable of emitting light of the first color, and the light emitting layer EL of the fourth light emitting device LED2 and the light emitting layer EL of the light emitting device LED5 may include a material capable of emitting light of the second color, and the light emitting layer EL of the third light emitting device LED3 and the light emitting layer EL of the sixth light emitting device LED6 may include a material capable of emitting light of the third color. For example, the first color may be red, the second color may be green, and the third color may be blue. However, the present disclosure is not necessarily limited thereto.

Meanwhile, functional layers such as a hole injection layer, a hole transport layer, an electron transport layer, and an electron injection layer may be additionally disposed above and/or below the light emitting layer EL.

The common electrode CE may be disposed on the light emitting layer EL. The common electrode CE may include a conductive material such as a metal, alloy, conductive metal nitride, conductive metal oxide, or transparent conductive material. In an embodiment, the common electrode CE may extend continuously across a plurality of pixels.

As a result, the first light emitting device LED1 may include the first pixel electrode PE1, the light emitting layer EL, and the common electrode CE, the second light emitting device LED2 may include the second pixel electrode PE2, the light emitting layer EL, and the common electrode CE, the third light emitting device LED3 may include the third pixel electrode PE3, the light emitting layer EL, and the common electrode CE, the fourth light emitting device LED4 may include the fourth pixel electrode PE4, the light emitting layer EL, and the common electrode CE, the fifth light emitting device LED5 may include the fifth pixel electrode PE5, the light emitting layer EL, and the common electrode CE, and the sixth light emitting device LED6 may include the sixth pixel electrode PE6, the light emitting layer EL, and the common electrode CE.

The first to third light emitting devices LED1, LED2, and LED3 may provide light of different colors to the light emitting area EA, and the fourth to sixth light emitting devices LED4, LED5, and LED6 may provide light of different colors to the light emitting area EA.

For example, the first light emitting device LED1 and the fourth light emitting device LED4 may provide light of the first color to the light emitting area EA, the second light emitting device LED2 and the fifth light emitting device LED5 may provide light of the second color to the light emitting area EA, and the third light emitting device LED3 and the sixth light emitting device LED6 may provide light of the third color to the light emitting area EA. As described above, the first color may be red, the second color may be green, and the third color may be blue. However, the present disclosure is not necessarily limited thereto.

In an embodiment, the display device 1 may operate in a normal driving mode or a private driving mode. The normal driving mode may be a mode that provides a wide viewing angle in all directions. That is, the normal driving mode may be referred to as a wide viewing angle mode. The private driving mode may be a mode that provides a narrow viewing angle in a predetermined direction, and may be a mode in which a side view is low-quality or blocked compared to the normal driving mode. "Side view," as used herein, is a view of the display device 1 from an area that is not a primary viewing zone, which is usually in front of a center area of the display device 1. The private driving mode may be referred to as a narrow viewing angle mode, wherein the image on the display device 1 is clearly visible only from the primary viewing zone of the display device 1. In private driving mode, the side view of the display device 1 may be unclear or blocked.

When the controller 170 (in FIG. 1) receives a selection signal indicting operation in either the normal driving mode or the private driving mode, the controller 170 (see FIG. 1) may output a control signal to the scan driver 130 (in FIG. 1) and the data driver 150 (in FIG. 1) so that the display device 1 operates in the normal driving mode or the private driving mode according to the selection signal.

In the private driving mode, the first to third light emitting devices LED1, LED2, and LED3 arranged in each of the unit display areas UPXA may all be selected by the scan signal and emit light with a brightness corresponding to the data signal. In the private driving mode, the light emission function of the fourth, fifth, and sixth light emitting devices LED4, LED5, and LED6 arranged in each of the unit display areas UPXA may be turned off, such that these light emitting devices LED4, LED5, and LED6 do not emit light. Here, non-emission may be implemented by a pixel not being selected by a scan signal and therefore not receiving a data signal, or a pixel being selected by a scan signal but receiving a black data signal and expressing black.

In normal driving mode (wide viewing angle mode), the fourth to sixth light emitting devices LED4, LED5, and LED6 arranged in each of the unit display areas UPXA may all be selected by the scan signal and emit light with a luminance corresponding to the data signal. In the normal driving mode, the first to third light emitting devices LED1, LED2, and LED3 arranged in each of the unit display areas UPXA may not emit light or emit light selectively, depending on the embodiment. However, the present disclosure is not necessarily limited thereto. For example, in the normal driving mode, the first to third light emitting devices LED1, LED2, and LED3 arranged in each of the unit display areas UPXA may also emit light together with the fourth to sixth light emitting devices LED4, LED5, and LED6.

The encapsulation layer ENC may be disposed on the first to sixth light emitting devices LED1, LED2, LED3, LED4, LED5, and LED6. The encapsulation layer ENC may protect the first to sixth light emitting devices LED1, LED2, LED3, LED4, LED5, and LED6 from external moisture, heat, shock, or the like. Although not shown, the encapsulation layer ENC may include a first inorganic encapsulation layer, an organic encapsulation layer disposed on the first inorganic encapsulation layer, and a second inorganic encapsulation layer disposed on the organic encapsulation layer.

The light transmission layer LTL may be disposed on the encapsulation layer ENC. The light transmission layer LTL may define an opening which exposes an upper surface of the encapsulation layer ENC. For example, the opening may penetrate the light transmission layer LTL. In an embodiment, the light transmission layer LTL may have a grid shape in a plan view.

The light transmission layer LTL may include an organic insulating material and/or an inorganic insulating material having a relatively high light transmittance.

In an embodiment, a separate insulating layer may be additionally disposed between the encapsulation layer ENC and the light transmission layer LTL. For example, a sensing layer including at least one touch electrode and at least one touch insulating layer may be disposed between the encapsulation layer ENC and the light transmission layer LTL. In this case, the opening defined by the light transmission layer LTL may expose an upper surface of the insulating layer.

The partition patterns PW may be disposed on the encapsulation layer ENC. The partition patterns PW may be disposed in the opening defined in the light transmission layer LTL. For example, the partition patterns PW may contact an inner surface of the light transmission layer LTL defining the opening. Accordingly, the light transmission layer LTL may be disposed between the partition patterns PW.

In an embodiment, as illustrated in FIG. 4, the partition patterns PW may extend in the first direction DR1 and be spaced apart from each other along the second direction DR2. In other words, the partition patterns PW may be parallel to each other. However, an arrangement structure of the partition patterns PW is not necessarily limited thereto.

At least one of the partition patterns PW may partially cover the first pixel opening PO1 in a plan view, at least one of the partition patterns PW may partially cover the second pixel opening PO2 in a plan view, and at least one of the partition patterns PW may partially cover the third pixel opening PO3 in a plan view.

In other words, at least one of the partition patterns PW may extend in the first direction DR1 over the first pixel opening PO1, at least one of the partition patterns PW may extend in the first direction DR1 over the second pixel opening PO2, and at least one of the partition patterns PW may extend in the first direction DR1 over the third pixel opening PO3.

For example, as illustrated in FIG. 4, two of the partition patterns PW may continuously extend in the first direction DR1 over the first pixel opening PO1 and the second pixel opening PO2, and two other partition patterns PW may extend in the first direction DR1 over the third pixel opening PO3. In the particular embodiment of FIG. 4, each pair partition patterns PW extends parallel to each another. However, the present disclosure is not necessarily limited thereto, and the number, length, and orientation of partition patterns PW extending over the first to third pixel openings PO1, PO2, PO3 in a plan view may be changed depending on embodiments.

The partition patterns PW may adjust a viewing angle of light emitted from the first to third light emitting devices LED1, LED2, and LED3. For example, light emitted from the first to third light emitting devices LED1, LED2, and LED3 may be incident on the partition patterns PW. At least some of the light incident on the partition patterns PW may be absorbed or blocked by the partition patterns PW. Accordingly, the partition patterns PW may adjust the viewing angle of light emitted from the first to third light emitting devices LED1, LED2, and LED3.

In an embodiment, the partition patterns PW may include a material that has relatively low transmittance and reflectance and relatively high absorption. For example, the partition patterns PW may include black dye, black pigment, carbon black, chrome, or the like. These can be used alone or in combination with each other.

In an embodiment, the partition patterns PW may include molybdenum-tantalum oxide (MTO). In this case, the partition patterns PW may have a multi-layer structure. For example, the partition patterns PW may have a three-layer structure such as MTO/Mo/MTO, MTO/Cu/MTO, and MTO/Al/MTO. Optionally, the partition patterns PW may have a two-layer structure such as MTO/Mo, MTO/Cu, and MTO/Al. However, the present disclosure is not necessarily limited thereto, and in other examples, the partition patterns PW may have a MTO single-layer structure or a multi-layer structure of four or more layers.

Meanwhile, the partition patterns PW may be spaced apart from the fourth to sixth pixel openings PO4, PO5, and PO6 in a plan view. In other words, the partition patterns PW may not overlap the fourth to sixth pixel openings PO4, PO5, and PO6 in a plan view.

Light emitted from the fourth to sixth light emitting devices LED4, LED5, and LED6 may not be incident on the partition patterns PW. Accordingly, the partition patterns PW may not affect a viewing angle of light emitted from the fourth to sixth light emitting elements LED4, LED5, and LED6.

As described above, in the private driving mode, the first to third light emitting devices LED1, LED2, and LED3 may emit light, and the fourth to sixth light emitting devices LED4, LED5, and LED6 may not emit light. That is, in the private driving mode, among the light emitting devices disposed in each of the unit display areas UPXA, light emitting devices that overlap the partition patterns PW may emit light, and light emitting devices that do not overlap the partition patterns PW may not emit light. Accordingly, the path of some of the light emitted from the light emitting devices in the private driving mode may be blocked and/or changed by the partition patterns PW. Thus, when viewed obliquely from left, right, upper, or lower side of the display device 1, user's field of view may be narrowed or blocked. This way, the viewing angle of the display device 1 may be adjusted. That is, the display device 1 may be driven in the narrow viewing angle mode (i.e., the private driving mode).

In the normal driving mode, the fourth to sixth light emitting devices LED4, LED5, and LED6 may emit light. That is, in the normal driving mode, among the light emitting devices disposed in each of the unit display areas UPXA, light emitting devices that do not overlap the partition patterns PW may emit light. Accordingly, the display device 1 may be driven in the wide viewing angle mode.

Meanwhile, at least one of the partition patterns PW may not overlap all of the first to sixth pixel openings PO1, PO2, PO3, PO4, PO5, and PO6 in a plan view. That is, at least one of the partition patterns PW may be disposed only in the non-light emitting area NEA. However, the present disclosure is not necessarily limited thereto, and in another example, all of the partition patterns PW may overlap at least one of the first to third pixel openings PO1, PO2, and PO3 in a plan view.

As the partition patterns PW pass over each of the first to third pixel openings PO1, PO2, and PO3, an effective opening area EO corresponding to each of the first to third pixel openings PO1, PO2, and PO3 may be defined.

Specifically, the effective opening area EO of the first pixel opening PO1 may be an area equal to the total area TA1 of the first pixel opening PO1 excluding an overlapping area covered by the partition patterns PW in a plan view. For example, as illustrated in FIG. 4, when and the part of the first pixel opening PO1 that is covered by the partition patterns PW is defined as a first area A1 and the part of the first pixel opening PO1 that is covered by the partition patterns PW is defined as a second area A2, the total covered area of the first pixel opening PO1 may be a sum of the first area A1 and the second area A2. That is, the total covered area of the first pixel opening PO1 may mean a total covered area of the first pixel opening PO1 that is covered by the partition patterns PW, out of the total area TA1 (covered and not covered) of the pixel opening PO1.

The effective opening area EO of the second pixel opening PO2 may be an area equal to the total area TA2 of the second pixel opening PO2 excluding the total covered area of the second pixel opening PO2 in a plan view. For example, as illustrated in FIG. 4, when an area of the second pixel opening PO2 that is covered by one of the partition patterns PW is defined as a third area A3 and an area of the second pixel opening PO2 that is covered by another partition pattern PW is defined as a fourth area A4, the total covered area of the second opening PO2 may be a sum of the third area A3 and the fourth area A4. That is, the total covered area of the second pixel opening PO2 may mean a total covered area of the second pixel opening PO2 out of the total area TA2 (covered and not covered) of the pixel opening PO2.

The effective opening area EO of the third pixel opening PO3 may be an area equal to the total area TA3 of the third pixel opening PO3 excluding the total covered area of the third pixel opening PO3 in a plan view. For example, as illustrated in FIG. 4, when an area of the third pixel opening PO3 that is covered by one of the partition patterns PW is defined as a fifth area A5 and an area of the third pixel opening PO3 that is covered by another partition pattern PW is defined as a sixth area A6, the total covered area of the third opening PO3 may be a sum of the fifth area A5 and the sixth area A6. That is, the total covered area of the third pixel opening PO3 may mean a total covered area of the third pixel opening PO3 out of the total area TA3 (covered and not covered) of the pixel opening PO3.

In a plan view, a first overlap ratio, a second overlap ratio, and a third overlap ratio may be substantially the same for the first, second, and third pixel openings PO1, PO2, and PO3. The first overlap ratio is a ratio of an area of the first pixel opening PO1 that is covered the partition patterns PW to the total area TA1 of the first pixel opening PO1. The second overlap ratio is a ratio of an area of the second pixel opening PO2 that is covered by the partition patterns PW to the total area TA2 of the second pixel opening PO2. The third overlap ratio is a ratio of an area of the third pixel opening PO3 that is covered by the partition patterns PW to the total area TA3 of the third pixel opening PO3.

A first overlap ratio, a second overlap ratio, and a third overlap ratio may be substantially equal to one another. The first overlap ratio may be a ratio of the total covered area (i.e., the sum of the first area A1 and the second area A2) of the first pixel opening PO1 to the total area TA1 of the first pixel opening PO1. The second overlap ratio may be a ratio of the total covered area (i.e., the sum of the third area A3 and the fourth area A4) of the second pixel opening PO2 to the total area TA2 of the second pixel opening PO2. The third overlap ratio may be a ratio of the total covered area (i.e., the sum of the fifth area A5 and the sixth area A6) of the third pixel opening PO3 to the total area TA3 of the third pixel opening PO3.

In other words, a first opening ratio, a second opening ratio, and a third opening ratio may be substantially equal to one another. The first opening ratio is a ratio of an area of the first pixel opening PO1 that is not covered by the partition patterns PW to the total area TA1 of the first pixel opening PO1. The second opening ratio is a ratio of an area of the second pixel opening PO2 that is not covered by the partition patterns PW to the total area TA2 of the second pixel opening PO2. The third opening ratio is a ratio of an area of the third pixel opening PO3 that is not covered by the partition patterns PW to the total area TA3 of the third pixel opening PO3. The area of a pixel opening that is not covered by the partition patterns PW is the area of the pixel opening that is adjacent to the portion that is covered by the partition patterns PW.

That is, a ratio of the effective opening area EO of the first pixel opening PO1 to the total area TA1 of the first pixel opening PO1, a ratio of effective opening area EO of the second pixel opening PO2 to the total area TA2 of the second pixel opening PO2, and a ratio of effective opening area EO of the third pixel opening PO3 to the total area TA3 of the third pixel opening PO3 may be substantially equal to one other.

Accordingly, even when different parts of the partition patterns PW extend over each of the first, second, and third pixel openings PO1, PO2, and PO3, the first pixel opening PO1, the second pixel opening PO2, and the third pixel aperture PO3 may have substantially equal effective aperture ratio.

Therefore, even when the display device 1 includes partition patterns PW for adjusting the viewing angle, a luminous efficiency of the first light emitting device LED1 corresponding to the first pixel opening PO1, a luminous efficiency the second light emitting device LED2 corresponding to the second pixel opening PO2, and a luminous efficiency the third light emitting device LED3 corresponding to the third pixel opening PO3 may be substantially equal to each other. Accordingly, lifespan characteristics of light emitting devices may be improved. Accordingly, lifespan characteristics of the display device 1 may be improved.

Figure 6:
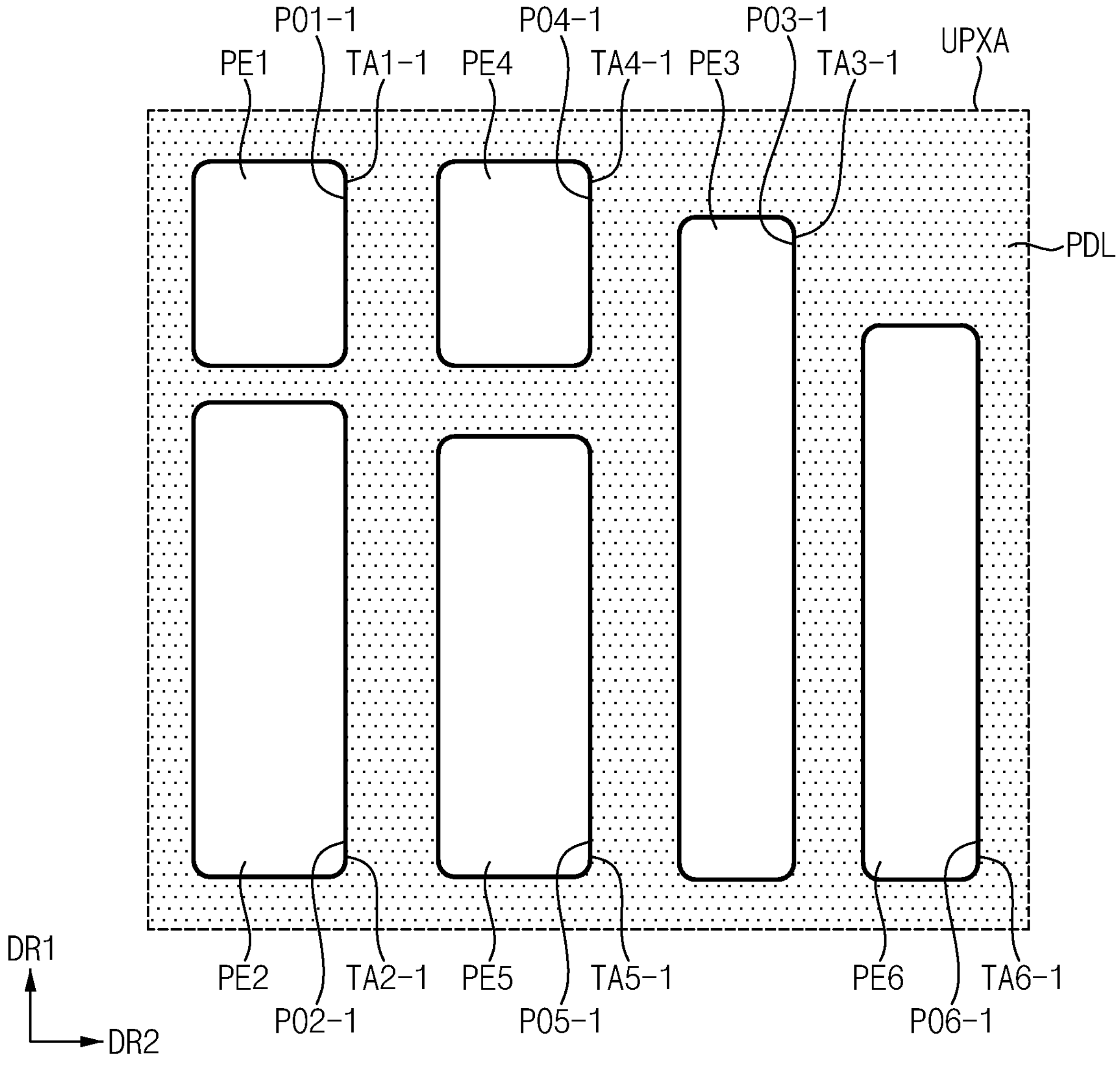
FIGS. 6 and 7 are plan views illustrating a unit pixel area of the display device of FIG. 2 according to an embodiment.
Figure 7:
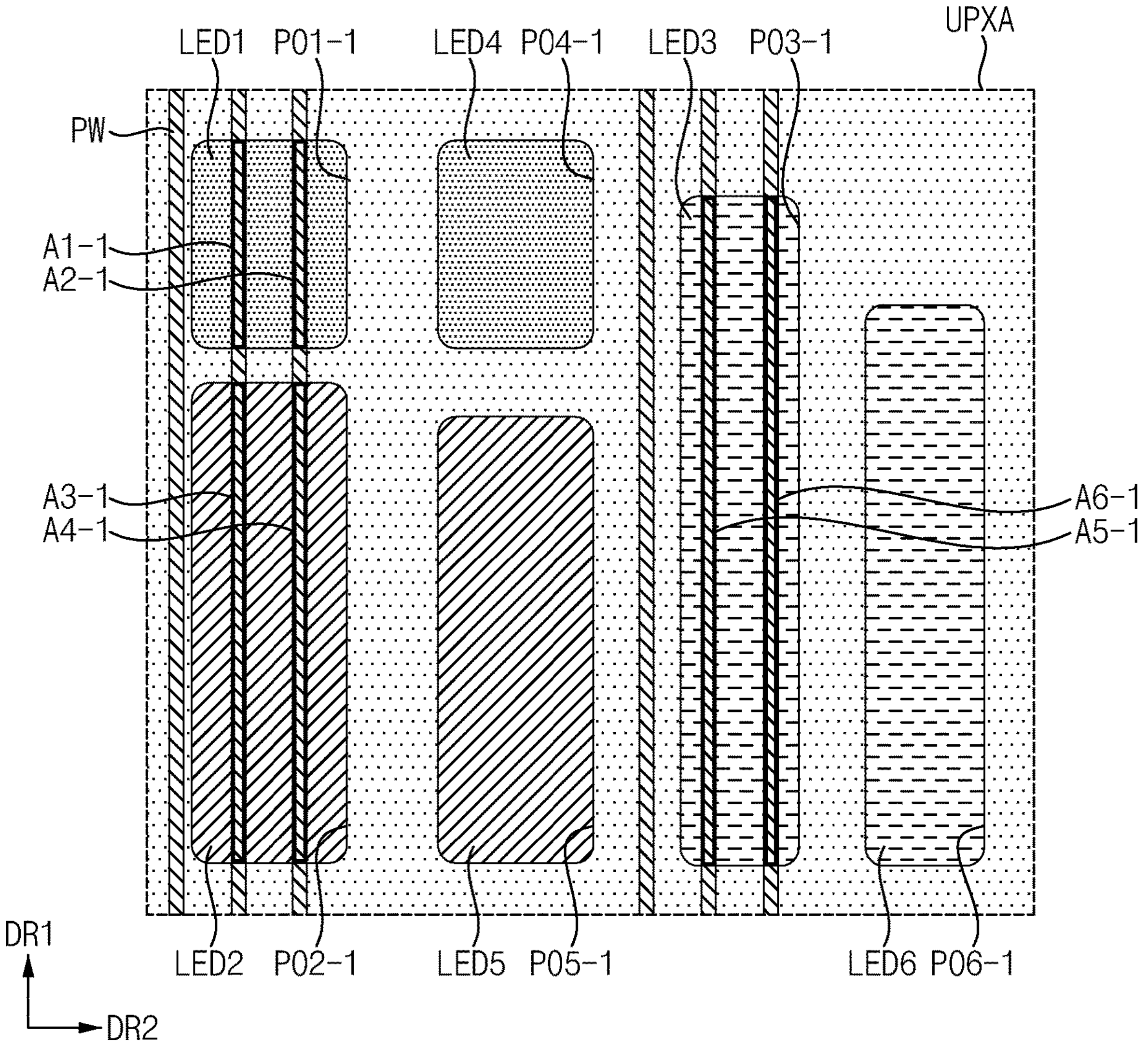

FIGS. 6 and 7 are plan views illustrating a unit pixel area of the display device of FIG. 2 according to an embodiment. For example, FIG. 6 is a plan view schematically illustrating an arrangement of a pixel electrode and a pixel defining layer of the display device of FIG. 2 according to an embodiment, and FIG. 7 is a plan view schematically illustrating an arrangement of light emitting devices and partition patterns of the display device of FIG. 2 according to an embodiment.

Each of the unit pixel areas UPXA described with reference to FIGS. 6 and 7 may be substantially the same as the unit pixel areas UPXA described with reference to FIGS. 3 and 4 except for first to sixth pixel openings PO1-1, PO2-1, PO3-1, PO4-1, PO5-1, and PO6-1. Hereinafter, a description will focus on differences from the unit pixel areas described with reference to FIGS. 3 and 4, and description of overlapping content will be omitted.

Referring to FIGS. 6 and 7, the pixel defining layer PDL may define a first pixel opening PO1-1 positioned above a portion of the first pixel electrode PE1, a second pixel opening PO2-1 positioned above a portion of the second pixel electrode PE2, a third pixel opening PO3-1 positioned above a portion of the third pixel electrode PE3, a fourth pixel opening PO4-1 positioned above a portion of the fourth pixel electrode PE4, a fifth pixel opening PO5-1 positioned above a portion of the fifth pixel electrode PE5, and a sixth pixel opening PO6-1 positioned above a portion of the sixth pixel electrode PE6. The openings PO1-1, PO2-1, PO3-1, PO4-1, PO5-1, and PO6-1 extend through the thickness of the pixel defining layer PDL to surfaces of the first pixel electrode PE1, the second pixel electrode PE2, the third pixel electrode PE3, the fourth pixel electrode PE4, the fifth pixel electrode PE5, and the sixth pixel electrode PE6, respectively.

In an embodiment, the first to sixth pixel openings PO1-1, PO2-1, PO3-1, PO4-1, PO5-1, and PO6-1 defined in each of the unit pixel areas UPXA may be substantially the same as the arrangement structure of the first to sixth pixel openings PO1, PO2, PO3, PO4, PO5, and PO6 described with reference to FIGS. 3 and 4. That is, an arrangement structure of the first to sixth pixel openings PO1-1, PO2-1, PO3-1, PO4-1, PO5-1, and PO6-1 defined in each of the unit pixel areas UPXA may be an S-stripe structure.

In a plan view, a total area TA1-1 of the first pixel opening PO1-1 may be substantially equal to a total area TA4-1 of the fourth pixel opening PO4-1. In other words, an aperture ratio of the first pixel opening PO1-1 may be substantially equal to an aperture ratio of the fourth pixel opening PO4-1.

In an embodiment, a length of a long side of the first pixel opening PO1-1 and a length of a long side of the fourth pixel opening PO4-1 may be substantially the same, and a length of a short side of the first pixel opening PO1-1 and a length of a short side the fourth pixel opening PO4 may be substantially the same. Accordingly, the total area TA1-1 of the first pixel opening PO1-1 may be substantially equal to the total area TA4-1 of the fourth pixel opening PO4-1. However, the present disclosure is not necessarily limited thereto, and as long as the total area TA1-1 of the first pixel opening PO1-1 and the total area TA4-1 of the fourth pixel opening PO4-1 are the same, a planar shape of the first pixel opening PO1-1 and a planar shape of the fourth pixel opening PO4-1 may be changed in various ways.

In an embodiment, in a plan view, a total area TA2-1 of the second pixel opening PO2-1 and a total area TA5-1 of the fifth pixel opening PO5-1 may be different from each other. In other words, an aperture ratio of the second pixel opening PO2-1 and an aperture ratio of the fifth pixel opening PO5-1 may be different from each other.

For example, the total area TA2-1 of the second pixel opening PO2-1 may be larger than the total area TA5-1 of the fifth pixel opening PO5-1. In other words, the aperture ratio of the second pixel opening PO2-1 may be larger than the aperture ratio of the fifth pixel opening PO5-1.

In an embodiment, a long side of the second pixel opening PO2-1 may be defined to be longer than a long side of the fifth pixel opening PO5-1 in the first direction DR1. That is, the second pixel opening PO2-1 may be longer in the first direction DR1 than the fifth pixel opening PO5-1. Additionally, a length of a short side of the second pixel opening PO2-1 and a length of a short side of the fifth pixel opening PO5-1 may be substantially the same. Accordingly, the total area TA2-1 of the second pixel opening PO2-1 may be larger than the total area TA5-1 of the fifth pixel opening PO5-1. However, the present disclosure is not necessarily limited thereto, and as long as the total area TA2-1 of the second pixel opening PO2-1 is larger than the total area TA5-1 of the fifth pixel opening PO5-1, a planar shape of the second pixel opening PO2-1 and a planar shape of the fifth pixel opening PO5-1 may be changed in various ways.

In an embodiment, in a plan view, a total area TA3-1 of the third pixel opening PO3-1 and a total area TA6-1 of the sixth pixel opening PO6-1 may be different from each other. In other words, an aperture ratio of the third pixel opening PO3-1 and an aperture ratio of the sixth pixel opening PO6-1 may be different from each other.

For example, the total area TA3-1 of the third pixel opening PO3-1 may be larger than the total area TA6-1 of the sixth pixel opening PO6-1. In other words, the aperture ratio of the third pixel opening PO3-1 may be larger than the aperture ratio of the sixth pixel opening PO6-1.

In an embodiment, a long side of the third pixel opening PO3-1 may be defined to be longer than a long side of the sixth pixel opening PO6-1 in the first direction DR1. That is, the third pixel opening PO3-1 may be longer in the first direction DR1 than the sixth pixel opening PO6-1. Additionally, a length of a short side of the third pixel opening PO3-1 and a length of a short side of the sixth pixel opening PO6-1 may be substantially the same. Accordingly, the total area TA3-1 of the third pixel opening PO3-1 may be larger than the total area TA6-1 of the sixth pixel opening PO6-1. However, the present disclosure is not necessarily limited thereto, and as long as the total area TA3-1 of the third pixel opening PO3-1 is larger than the total area TA6-1 of the sixth pixel opening PO6-1, a planar shape of the third pixel opening PO3-1 and a planar shape of the sixth pixel opening PO6-1 may be changed in various ways.

Similarly to embodiments described above, in a plan view, the first overlap ratio, the second overlap ratio, and the third overlap ratio may be substantially the same for the first, second, and third pixel openings PO1-1, PO2-1, and PO3-1. The first overlap ratio is a ratio of an area of the first pixel opening PO1-1 that is covered by the partition patterns PW to the total area TA1-1 of the first pixel opening PO1-1, the second overlap ratio is a ratio of an area of the second pixel opening PO2-1 that is covered by the partition patterns PW to the total area TA2-1 of the second pixel opening PO2-1, and the third overlap ratio is a ratio of an area of the third pixel opening PO3-1 that is covered by the partition patterns PW to the total area TA3-1 of the third pixel opening PO3-1.

The first overlap ratio (i.e., the sum of a first area A1-1 and a second area A2-1), the second overlap ratio (i.e., the sum of a third area A3-1 and a fourth area A4-1, and the third overlap ratio (i.e., the sum of a fifth area A5-1 and a sixth area A6-1) may be substantially equal to each other.

In other words, a first opening ratio, a second opening ratio, and a third opening ratio may be substantially equal to one another. The first opening ratio is a ratio of an area of the first pixel opening PO1-1 that is not covered by the partition patterns PW to the total area TA1-1 of the first pixel opening PO1-1. The second opening ratio is a ratio of an area of the second pixel opening PO2-1 that is not covered by the partition patterns PW to the total area TA2-1 of the second pixel opening PO2-1. The third opening ratio is a ratio of an area of the third pixel opening PO3-1 that is not covered by the partition patterns PW to the total area TA3-1 of the third pixel opening PO3-1. As defined above, the area of a pixel opening that is not covered by the partition patterns PW is the area of the pixel opening that is adjacent to the portion that is covered by the partition patterns PW.

Figure 8:
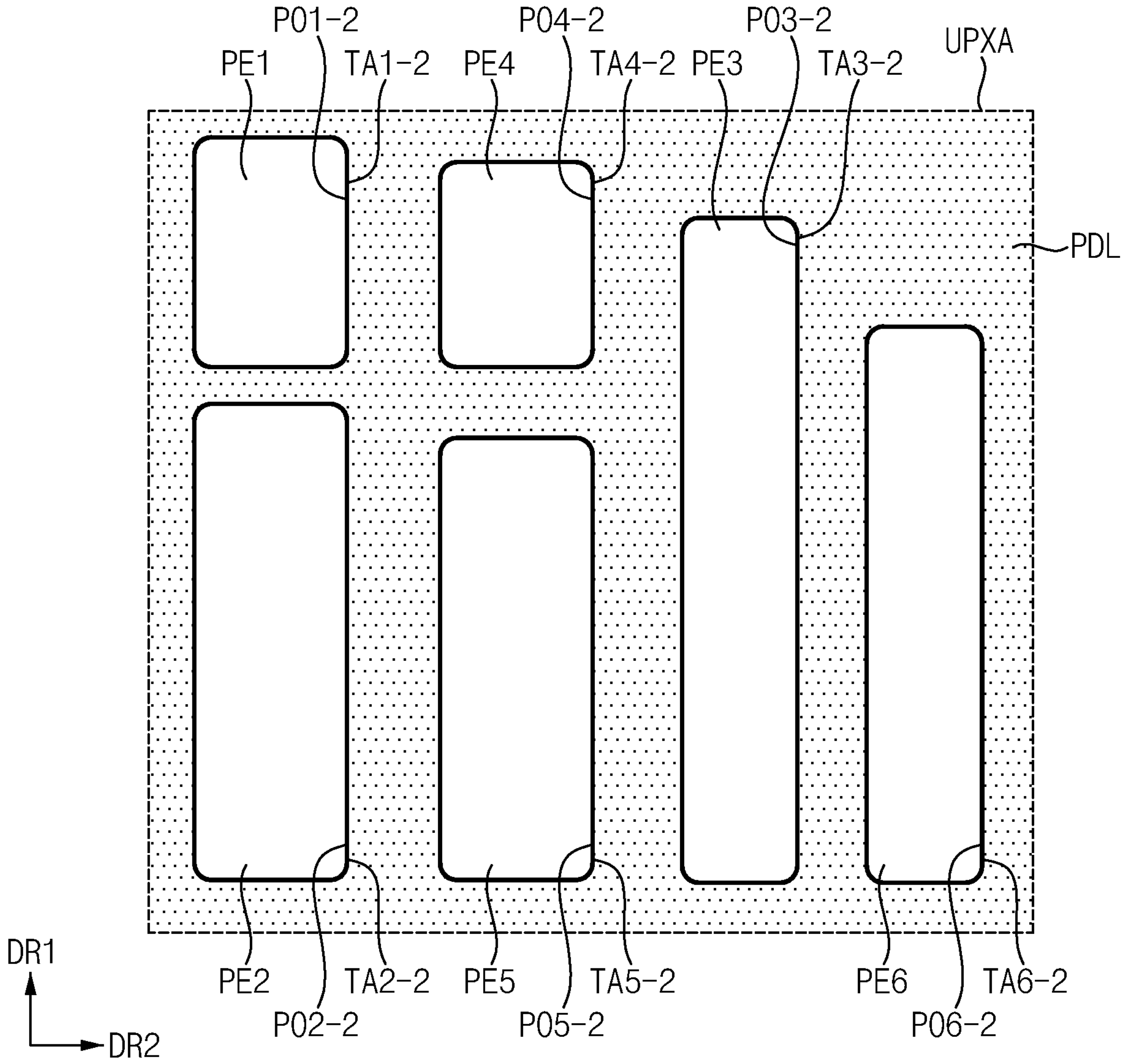
FIGS. 8 and 9 are plan views illustrating a unit pixel area of the display device of FIG. 2 according to an embodiment.
Figure 9:
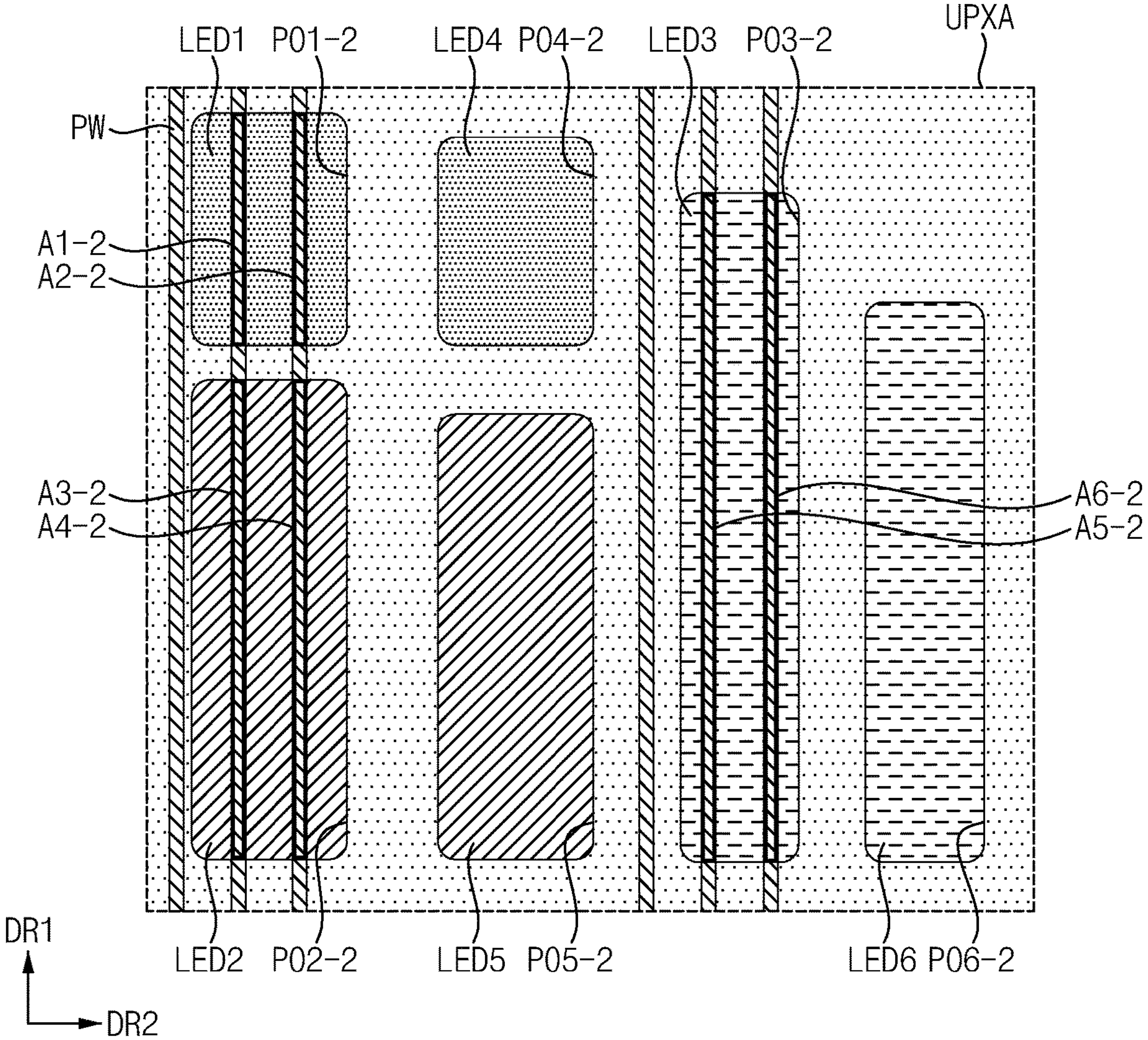

FIGS. 8 and 9 are plan views illustrating a unit pixel area of the display device of FIG. 2 according to an embodiment. For example, FIG. 8 is a plan view schematically illustrating an arrangement of a pixel electrode and a pixel defining layer of the display device of FIG. 2 according to an embodiment, and FIG. 9 is a plan view schematically illustrating an arrangement of light emitting devices and partition patterns of the display device of FIG. 2 according to an embodiment.

Each of the unit pixel areas UPXA described with reference to FIGS. 8 and 9 may be substantially the same as the unit pixel areas UPXA described with reference to FIGS. 3 and 4 except for first to sixth pixel openings PO1-2, PO2-2, PO3-2, PO4-2, PO5-2, and PO6-2. Hereinafter, a description will focus on differences from the unit pixel areas described with reference to FIGS. 3 and 4, and description of redundant content will be omitted.

Referring to FIGS. 8 and 9, the pixel defining layer PDL may define a first pixel opening PO1-2 positioned above and extending to the first pixel electrode PE1, a second pixel opening PO2-2 positioned above and extending to the second pixel electrode PE2, a third pixel opening PO3-2 positioned above and extending to the third pixel electrode PE3, a fourth pixel opening PO4-2 positioned above and extending to the fourth pixel electrode PE4, a fifth pixel opening PO5-2 positioned above and extending to the fifth pixel electrode PE5, and a sixth pixel opening PO6-2 positioned above and extending to the sixth pixel electrode PE6.

In an embodiment, the first to sixth pixel openings PO1-2, PO2-2, PO3-2, PO4-2, PO5-2, and PO6-2 defined in each of the unit pixel areas UPXA may be substantially the same as the arrangement structure of the first to sixth pixel openings PO1, PO2, PO3, PO4, PO5, and PO6 described with reference to FIGS. 3 and 4. That is, an arrangement structure of the first to sixth pixel openings PO1-2, PO2-2, PO3-2, PO4-2, PO5-2, and PO6-2 defined in each of the unit pixel areas UPXA may be an S-stripe structure.

In an embodiment, in a plan view, a total area TA1-2 of the first pixel opening PO1-2 and a total area TA4-2 of the fourth pixel opening PO4-2 may be different from each other. In other words, an aperture ratio of the first pixel opening PO1-2 and an aperture ratio of the fourth pixel opening PO4-2 may be different from each other.

For example, the total area TA1-2 of the first pixel opening PO1-2 may be larger than the total area TA4-2 of the fourth pixel opening PO4-2. In other words, the aperture ratio of the first pixel opening PO1-2 may be larger than the aperture ratio of the fourth pixel opening PO4-2.

In an embodiment, a long side of the first pixel opening PO1-2 may be longer than a long side of the fourth pixel opening PO4-2 in the first direction DR1. That is, the first pixel opening PO1-2 may be longer in the first direction DR1 than fourth pixel opening PO4-2. Additionally, a length of a short side of the first pixel opening PO1-2 and a length of a short side of the fourth pixel opening PO4-2 may be substantially the same. Accordingly, the total area TA1-2 of the first pixel opening PO1-2 may be larger than the total area TA4-2 of the fourth pixel opening PO4-2. However, the present disclosure is not necessarily limited thereto, and as long as the total area TA1-2 of the first pixel opening PO1-2 is larger than the total area TA4-2 of the fourth pixel opening PO4-2, a planar shape of first pixel opening PO1-2 and a planar shape of fourth pixel opening PO4-2 may be changed in various ways.

In an embodiment, in a plan view, a total area TA2-2 of the second pixel opening PO2-2 and a total area TA5-2 of the fifth pixel opening PO5-2 may be different from each other. In other words, an aperture ratio of the second pixel opening PO2-2 and an aperture ratio of the fifth pixel opening PO5-2 may be different from each other.

For example, the total area TA2-2 of the second pixel opening PO2-2 may be larger than the total area TA5-2 of the fifth pixel opening PO5-2. In other words, the aperture ratio of the second pixel opening PO2-2 may be larger than the aperture ratio of the fifth pixel opening PO5-2.

In an embodiment, a long side of the second pixel opening PO2-2 may be longer than a long side of the fifth pixel opening PO5-2 in the first direction DR1. That is, the second pixel opening PO2-2 may be longer in the first direction DR1 than the fifth pixel opening PO5-2. Additionally, a length of a short side of the second pixel opening PO2-2 and a length of a short side of the fifth pixel opening PO5-2 may be substantially the same. Accordingly, the total area TA2-2 of the second pixel opening PO2-2 may be larger than the total area TA5-2 of the fifth pixel opening PO5-2. However, the present disclosure is not necessarily limited thereto, and as long as the total area TA2-2 of the second pixel opening PO2-2 is larger than the total area TA5-2 of the fifth pixel opening PO5-2, a planar shape of the second pixel opening PO2-2 and a planar shape of the fifth pixel opening PO5-2 may be changed in various ways.

In an embodiment, in a plan view, a total area TA3-2 of the third pixel opening PO3-2 and a total area TA6-2 of the sixth pixel opening PO6-2 may be different from each other. In other words, an aperture ratio of the third pixel opening PO3-2 and an aperture ratio of the sixth pixel opening PO6-2 may be different from each other.

For example, the total area TA3-2 of the third pixel opening PO3-2 may be larger than the total area TA6-2 of the sixth pixel opening PO6-2. In other words, the aperture ratio of the third pixel opening PO3-2 may be larger than the aperture ratio of the sixth pixel opening PO6-2.

In an embodiment, a long side of the third pixel opening PO3-2 may be longer than a long side of the sixth pixel opening PO6-2 in the first direction DR1. That is, the third pixel opening PO3-2 may be longer in the first direction DR1 than the sixth pixel opening PO6-2. Additionally, a length of a short side of the third pixel opening PO3-2 and a length of a short side of the sixth pixel opening PO6-2 may be substantially the same. Accordingly, the total area TA3-2 of the third pixel opening PO3-2 may be larger than the total area TA6-2 of the sixth pixel opening PO6-2. However, the present disclosure is not necessarily limited thereto, and as long as the total area TA3-2 of the third pixel opening PO3-2 is larger than the total area TA6-2 of the sixth pixel opening PO6-2, a planar shape of the third pixel opening PO3-2 and a planar shape of the sixth pixel opening PO6-2 may be changed in various ways.

Similarly to the embodiments above, in a plan view, referring to FIGS. 8 and 9, the first overlap ratio, the second overlap ratio, and the third overlap ratio may be equal to one another. The first overlap ratio is a ratio of an area of the first pixel opening PO1-2 that is covered by the partition patterns PW to the total area TA1-2 of the first pixel opening PO1-2, the second overlap ratio is a ratio of an area of the second pixel opening PO2-2 that is covered by the partition patterns PW to the total area TA2-2 of the second pixel opening PO2-2, and the third overlap ratio is a ratio of an area of the third pixel opening PO3-2 that is covered by the partition patterns PW to the total area TA3-2 of the third pixel opening PO3-2.

That is, the first overlap ratio (i.e., ratio of the sum of a first area A1-2 and a second area A2-2 to the total area TA1-2 of the first pixel opening PO1-2), the second overlap ratio (i.e., ratio of the sum of a third area A3-2 and a fourth area A4-2 to the total area TA2-2 of the second pixel opening PO2-2), and the third overlap ratio (i.e., the ratio of the sum of a fifth area A5-2 and a sixth area A6-2 to the total area TA3-2 of the third pixel opening PO3-2) may be substantially equal to each other.

In other words, the first opening ratio, the second opening ratio, and the third opening ratio may be substantially the same for the first pixel opening PO1-2, the second pixel opening PO2-2, and the third pixel opening PO3-2. The first opening ratio is a ratio of an area of the first pixel opening PO1-2 that is not covered by the partition patterns PW to the total area TA1-2 of the first pixel opening PO1-2, the second opening ratio is a ratio of an area of the second pixel opening PO2-2 that is not covered by the partition patterns PW to the total area TA2-2 of the second pixel opening PO2-2, and the third opening ratio is a ratio of an area of the third pixel opening PO3-2 that is not covered by the partition patterns PW to the total area TA3-2 of the third pixel opening PO3-2. As defined above, the area of a pixel opening that is not covered by the partition patterns PW is the area of the pixel opening that is adjacent to the portion that is covered by the partition patterns PW.

Figure 10:
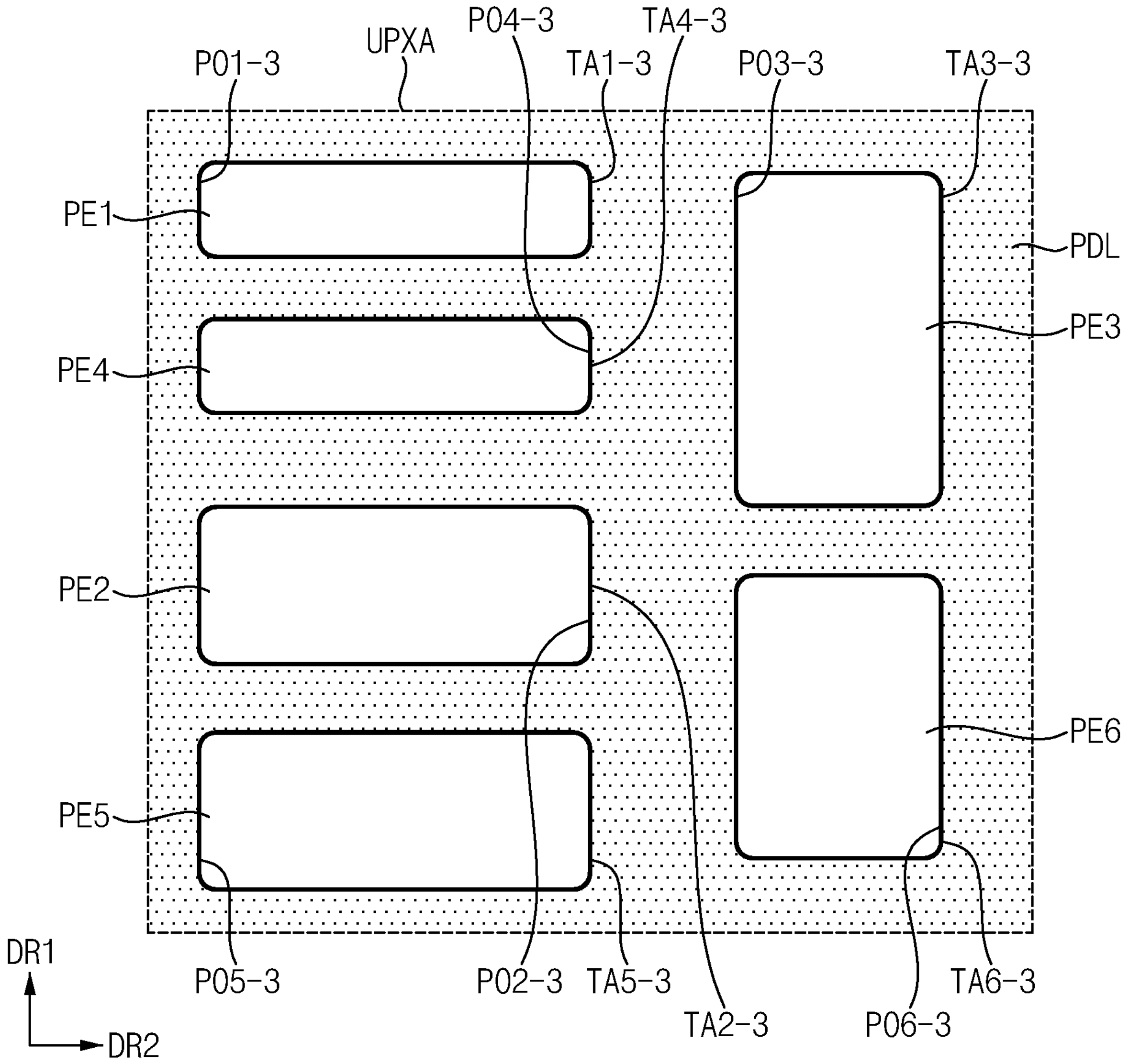
FIGS. 10 and 11 are plan views illustrating a unit pixel area of the display device of FIG. 2 according to an embodiment.
Figure 11:
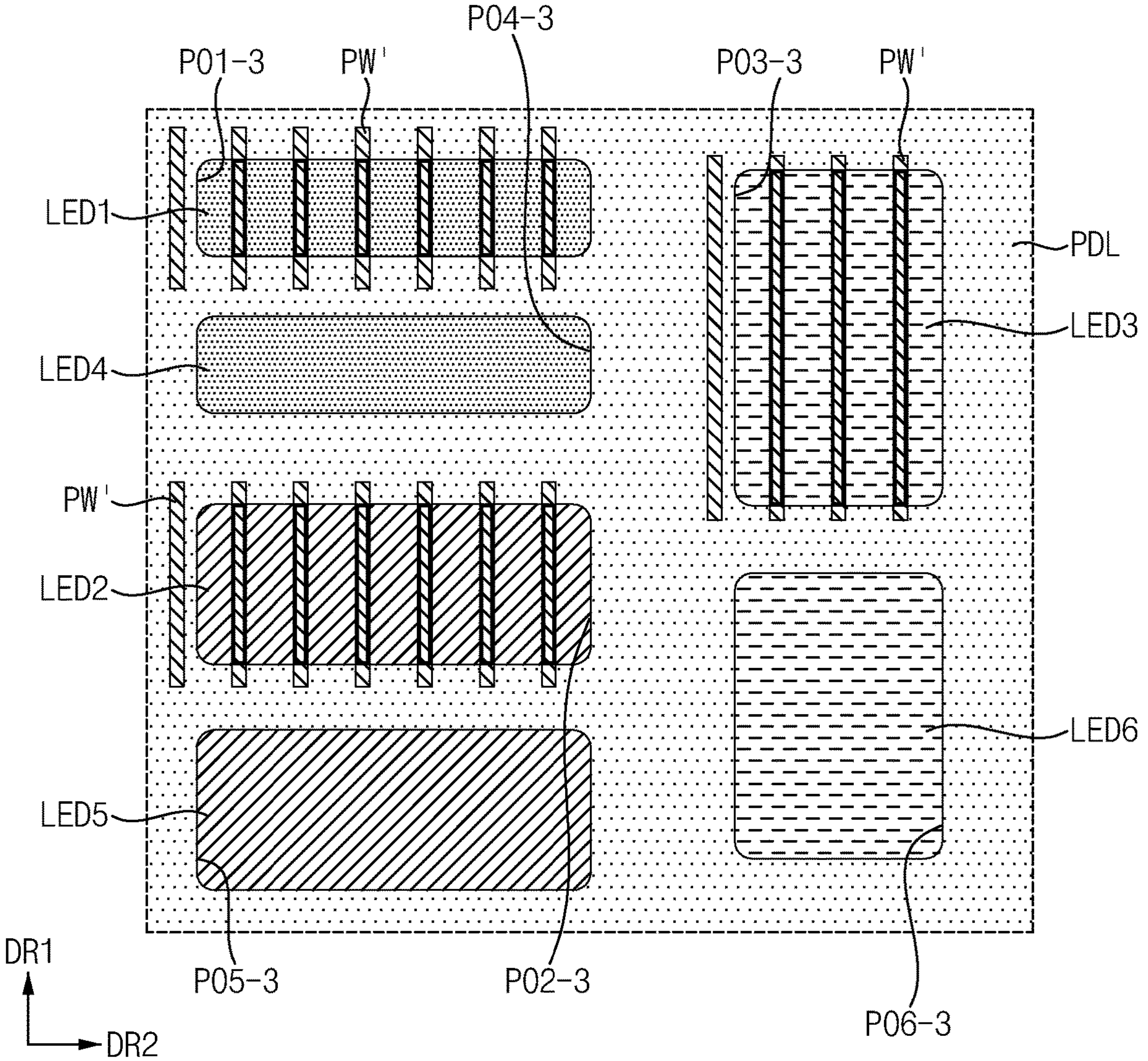

FIGS. 10 and 11 are plan views illustrating a unit pixel area of the display device of FIG. 2 according to an embodiment. For example, FIG. 10 is a plan view schematically illustrating an arrangement of a pixel electrode and a pixel defining layer of the display device of FIG. 2 according to an embodiment, and FIG. 11 is a plan view schematically illustrating an arrangement of light emitting devices and partition patterns of the display device of FIG. 2 according to an embodiment.

Each of the unit pixel areas UPXA described with reference to FIGS. 10 and 11 may be substantially the same as the unit pixel areas UPXA described with reference to FIGS. 3 and 4 except for first to sixth pixel openings PO1-3, PO2-3, PO3-3, PO4-3, PO5-3, and PO6-3 and partition walls PW. Hereinafter, a description will focus on differences from the unit pixel areas described with reference to FIGS. 3 and 4, and description of overlapping content will be omitted.

Referring to FIGS. 10 and 11, an arrangement structure of the first to sixth pixel openings PO1-3, PO2-3, PO3-3, PO4-3, PO5-3, and PO6-3 defined in each of the unit pixel areas UPXA may be an S-stripe structure. For example, the first pixel opening PO1-3, the second pixel opening PO2-3, the fourth pixel opening PO4-3, and the fifth pixel opening PO5-3 may be arranged in a first column, and the third pixel opening PO3-3 and the sixth pixel opening PO6-3 may be arranged in a second column adjacent to the first column.

In a plan view, a short side of each of the first pixel opening PO1-3, the second pixel opening PO2-3, the fourth pixel opening PO4-3, and the fifth pixel opening PO5-3 may extend in the first direction DR1. A long side of each of the third pixel opening PO3-3 and the sixth pixel opening PO6-3 may extend in the first direction DR1. The first pixel opening PO1-3, the fourth pixel opening PO4-3, the second pixel opening PO2-3, and the fifth pixel opening PO5-3 may be arranged in the first column spaced apart from each other so that their long sides face each other. The third pixel opening PO3-3 and the sixth pixel opening PO6-3 may be arranged in the second column spaced apart from each other so that their short sides face each other. However, the present disclosure is not necessarily limited thereto, and a planar arrangement of the first to sixth pixel openings PO1-3, PO2-3, PO3-3, PO4-3, PO5-3, and PO6-3 may be variously changed depending on embodiments.

At least one of the partition patterns PW may extend in the first direction DR1. In addition, at least one of the partition patterns PW may cover the first pixel opening PO1-3 in a plan view, at least one of the partition patterns PW may cover the second pixel opening PO2-3 in a plan view, and at least one of the partition patterns PW may cover the third pixel opening PO3-3 in a plan view. The number of partition patterns PW covering each of the first to third pixel openings PO1-3, PO2-3, PO3-3 in a plan view may be variously changed depending on the embodiment.

In addition, the partition patterns PW may be spaced apart from the fourth to sixth pixel openings PO4-3, PO5-3, and PO6-3 in a plan view to avoid overlapping the fourth to sixth pixel openings PO4-3, PO5-3, and PO6-3.

A total area TA3-3 of the third pixel opening PO3-3 and a total area TA6-3 of the sixth pixel opening PO6-3 may be different from each other. In other words, an aperture ratio of the third pixel opening PO3-3 and an aperture ratio of the sixth pixel opening PO6-3 may be different from each other.

For example, the total area TA3-3 of the third pixel opening PO3-3 may be larger than the total area TA6-3 of the sixth pixel opening PO6-3. In other words, the aperture ratio of the third pixel opening PO3-3 may be larger than the aperture ratio of the sixth pixel opening PO6-3.

In addition, in a plan view, the first overlap ratio, the second overlap ratio, and the third overlap ratio may be substantially the same for the first, second, and third pixel openings PO1-3, PO2-3, PO3-3. The first overlap ratio is a ratio of an area of the first pixel opening PO1-3 that is covered by the partition patterns PW to the total area TA1-3 of the first pixel opening PO1-3, the second overlap ratio is a ratio of an area of the second pixel opening PO2-3 that is covered by the partition patterns PW to the total area TA2-3 of the second pixel opening PO2-3, and the third overlap ratio is a ratio of an area of a portion of the third pixel opening PO3-3 that is covered by the partition patterns PW to the total area TA3-3 of the third pixel opening PO3-3.

The first opening ratio, the second opening ratio, and the third opening ratio may be equal to one another as well. The first opening ratio is a ratio of an area of the first pixel opening PO1-3 that is not covered by the partition patterns PW to the total area TA1-3 of the first pixel opening PO1-3. The second opening ratio is a ratio of an area of the second pixel opening PO2-3 that is not covered by the partition patterns PW to the total area TA2-3 of the second pixel opening PO2-3. The third opening ratio is a ratio of an area of the third pixel opening PO3-3 that is not covered by the partition patterns PW to the total area TA3-3 of the third pixel opening PO3-3.

Meanwhile, in FIGS. 10 and 11, a total area TA1-3 of the first pixel opening PO1-3 is substantially the same as a total area TA4-3 of the fourth pixel opening PO4-3, and a total area TA2-3 of the second pixel opening PO2-3 is substantially the same as a total area TA5-3 of the fifth pixel opening PO5-3. However, the present disclosure is not necessarily limited thereto. For example, as described above with reference to FIGS. 6 to 9, the total area TA1-3 of the first pixel opening PO1-3 may be larger than the total area TA4-3 of the fourth pixel opening PO4-3, and the total area TA2-3 of the second pixel opening PO2-3 may be larger than the total area TA5-3 of the fifth pixel opening PO5-3.

Figure 12:
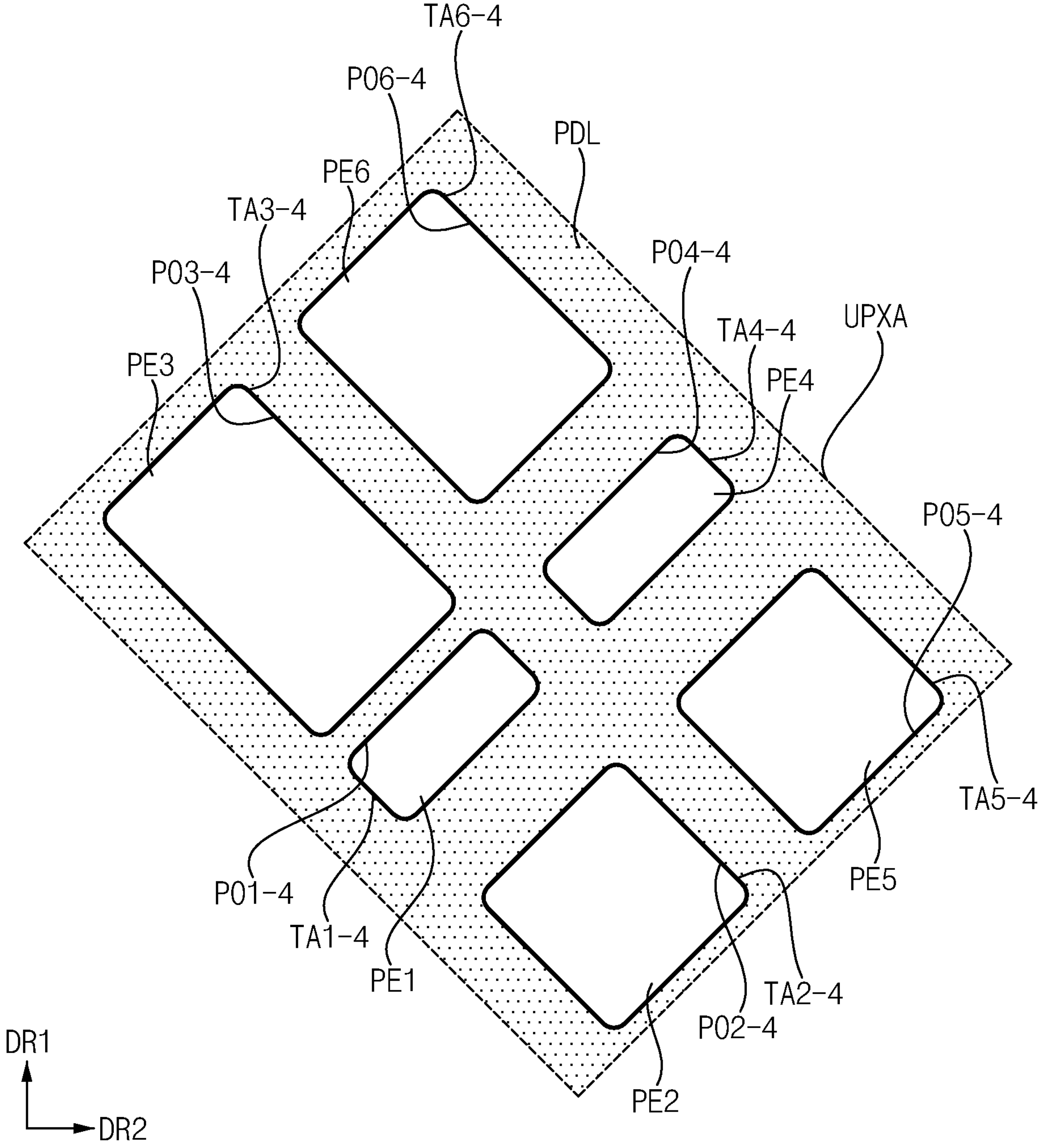
FIGS. 12 and 13 are plan views illustrating a unit pixel area of the display device of FIG. 2 according to an embodiment.
Figure 13:
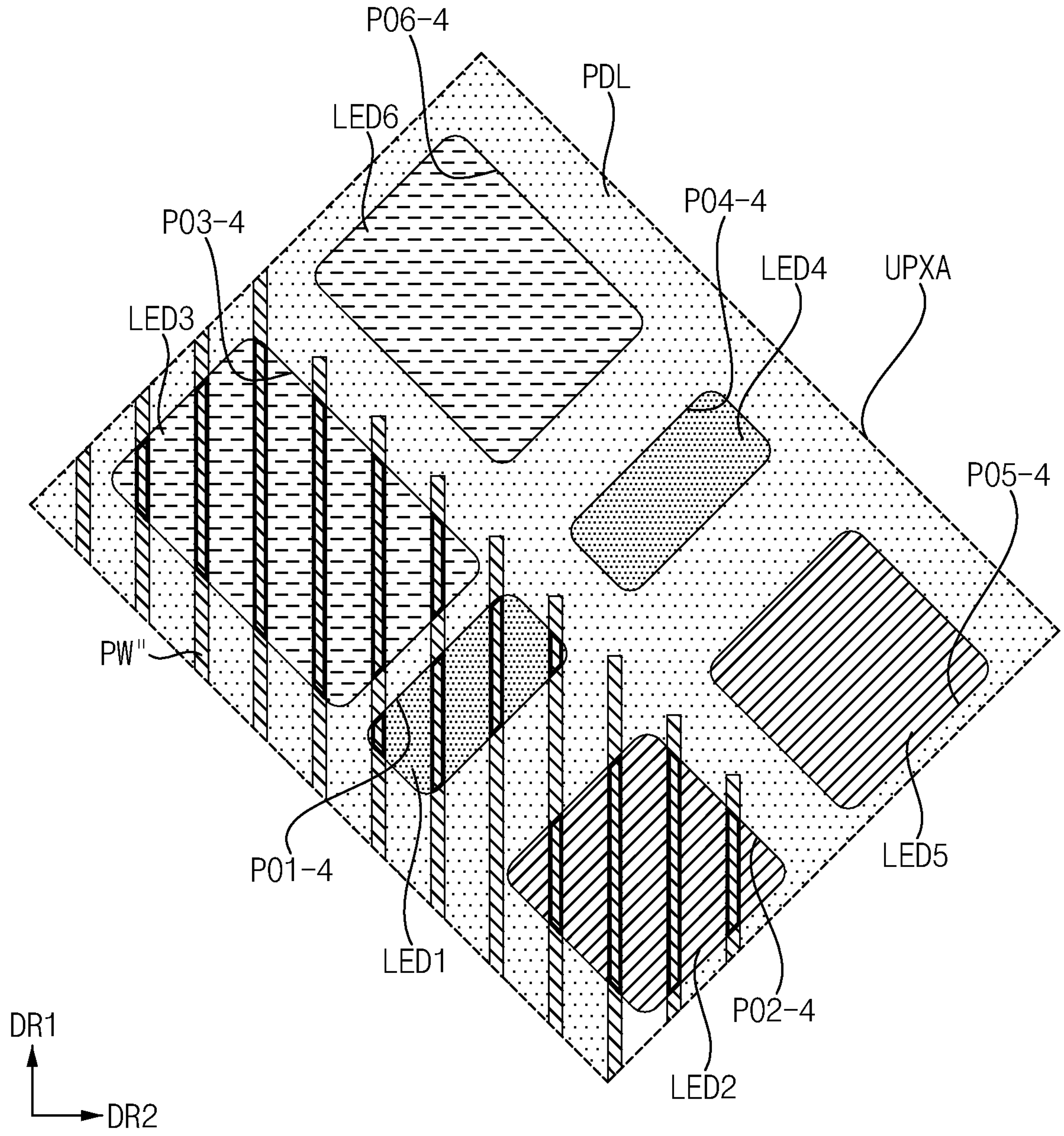

FIGS. 12 and 13 are plan views illustrating a unit pixel area of the display device of FIG. 2 according to an embodiment. For example, FIG. 12 is a plan view schematically illustrating an arrangement of a pixel electrode and a pixel defining layer of the display device of FIG. 2 according to an embodiment, and FIG. 13 is a plan view schematically illustrating an arrangement of light emitting devices and partition patterns of the display device of FIG. 2 according to an embodiment.

Each of the unit pixel areas UPXA described with reference to FIGS. 12 and 13 may be substantially the same as the unit pixel areas UPXA described with reference to FIGS. 3 and 4 except for first to sixth pixel openings PO1-4, PO2-4, PO3-4, PO4-4, PO5-4, and PO6-4 and partition walls PW". Hence, descriptions of FIG. 12 and FIG. 13 will focus on differences from the unit pixel areas described with reference to FIGS. 3 and 4, and any redundant description will be omitted.

Referring to FIGS. 12 and 13, an arrangement structure of the first to sixth pixel openings PO1-4, PO2-4, PO3-4, PO4-4, PO5-4, and PO6-4 defined in each of the unit pixel areas UPXA may be an H-stripe structure. For example, the first pixel opening PO1-4, the second pixel opening PO2-4, the third pixel opening PO3-4 may be arranged in a first column, and the fourth pixel opening PO4-4, the fifth pixel opening PO5-4, and the sixth pixel opening PO6-4 may be arranged in a second column adjacent to the first column. At this time, the first pixel opening PO1-4, the second pixel opening PO2-4, and the third pixel opening PO3-4 may be arranged in the first column along a diagonal direction with respect to both the first direction DR1 and the second direction DR2. In addition, the fourth pixel opening PO4-4, the fifth pixel opening PO5-4, and the sixth pixel opening PO6-6 may be arranged in the second column along the direction that is diagonal to both the first direction DR1 and the second direction DR2.

In the embodiment of FIG. 12 and FIG. 13, at least one of the partition patterns PW" may extend in the first direction DR1. In addition, at least one of the partition patterns PW" may cover the first pixel opening PO1-4 in a plan view, at least one of the partition patterns PW" may cover the second pixel opening PO2-4 in a plan view, and at least one of the partition patterns PW" may cover the third pixel opening PO3-4 in a plan view. The number of partition patterns PW" covering each of the first to third pixel openings PO1-4, PO2-4, PO3-4 in a plan view may be variously changed depending on the embodiment.

In addition, the partition patterns PW" may be spaced apart from the fourth to sixth pixel openings PO4-4, PO5-4, and PO6-4 in a plan view. In other words, the partition patterns PW" may not cover a portion of the fourth to sixth pixel openings PO4-4, PO5-4, and PO6-4 in a plan view.

In a plan view, a total area TA3-4 of the third pixel opening PO3-4 and a total area TA6-4 of the sixth pixel opening PO6-4 may be different from each other. In other words, an aperture ratio of the third pixel opening PO3-4 and an aperture ratio of the sixth pixel opening PO6-4 may be different from each other.

For example, the total area TA3-4 of the third pixel opening PO3-4 may be larger than the total area TA6-4 of the sixth pixel opening PO6-4. In other words, the aperture ratio of the third pixel opening PO3-4 may be larger than the aperture ratio of the sixth pixel opening PO6-4.

In addition, in a plan view, the first overlap ratio, the second overlap ratio, and the third overlap ratio may be substantially equal to one another. As in the embodiments above, the first overlap ratio is a ratio of an area of the first pixel opening PO1-4 that is covered by the partition patterns PW" to the total area TA1-4 of the first pixel opening PO1-4. The second overlap ratio is a ratio of an area of the second pixel opening PO2-4 that is covered by the partition patterns PW" to the total area TA2-4 of the second pixel opening PO2-4. The third overlap ratio is a ratio of an area of the third pixel opening PO3-4 that is covered by the partition patterns PW" to the total area TA3-4 of the third pixel opening PO3-4.

In other words, the first opening ratio, the second opening ratio, and the third opening ratio may be substantially equal to each other. The first opening ratio is a ratio of an area of the first pixel opening PO1-4 that is not covered by the partition patterns PW" to the total area TA1-4 of the first pixel opening PO1-4. The second opening ratio is a ratio of an area of the second pixel opening PO2-4 that is not covered by the partition patterns PW" to the total area TA2-4 of the second pixel opening PO2-4. The third opening ratio is a ratio of an area of the third pixel opening PO3-4 that is not covered by the partition patterns PW" to the total area TA3-4 of the third pixel opening PO3-4.

Meanwhile, in FIGS. 10 and 11, a total area TA1-4 of the first pixel opening PO1-4 is substantially the same as a total area TA4-4 of the fourth pixel opening PO4-4, and a total area TA2-4 of the second pixel opening PO2-4 is substantially the same as a total area TA5-4 of the fifth pixel opening PO5-4. However, the present disclosure is not necessarily limited thereto. In another example such as the embodiments of FIG. 6, FIG. 7, FIG. 8, and FIG. 9, the total area TA1-4 of the first pixel opening PO1-4 may be larger than the total area TA4-4 of the fourth pixel opening PO4-4, and the total area TA2-4 of the second pixel opening PO2-4 may be larger than the total area TA5-4 of the fifth pixel opening PO5-4.

In the display device 1 including the partition patterns to be divided into a wide viewing angle mode and a narrow viewing angle mode, if, in each of the unit pixel areas UPXA, the pixel openings corresponding to the light emitting devices that emit the same color have the same total area (i.e. aperture ratio), depending on a planar shape of each of the pixel openings and/or the color of light emitted by the corresponding light emitting device, a deviation in effective aperture ratio may occur between the pixel openings overlapping the partition patterns.

According to some embodiments, in a plan view, the display device 1 may have a structure in which a total area of each of the pixel openings defined in each of unit pixel areas and corresponding to the light emitting devices that emit the same color is different. Accordingly, in the display device 1 according to some embodiments, pixel openings that are partially covered by the partition patterns may have the same effective aperture ratio.

That is, even when the display device 1 includes the partition patterns for adjusting the viewing angle, depending on a planar shape of each of the pixel openings and/or the color of light emitted by the corresponding light emitting device, a deviation in effective aperture ratio may not occur between the pixel openings overlapping the partition patterns. Accordingly, the luminous efficiency of the light emitting devices overlapping the partition patterns may be substantially the same. Accordingly, lifespan characteristics of light emitting devices overlapping with the partition patterns may be improved. Accordingly, lifespan characteristics of the display device 1 may be improved.

The disclosure should not be construed as being limited to the embodiments set forth herein. Rather, these embodiments are provided so that this disclosure will be thorough and complete and will fully convey the concept of the disclosure to those skilled in the art.

While the inventive concept has been particularly shown and described with reference to embodiments thereof, it will be understood by those of ordinary skill in the art that various changes in form and details may be made therein without departing from the spirit or scope of the inventive concept as defined by the following claims.

What is claimed is:

1. A display device comprising:

a substrate including unit pixel areas repeatedly arranged in a plan view;

first, second, and third light emitting devices disposed in each of the unit pixel areas on the substrate and emitting light of different colors;

a pixel defining layer defining a first pixel opening positioned above a first pixel electrode of the first light emitting device, a second pixel opening positioned above a second pixel electrode of the second light emitting device, and a third pixel opening positioned above a third electrode of the third light emitting device;

partition patterns disposed on the first, second, and third light emitting devices and partially covering the first, second, and third pixel openings, and wherein in a plan view, a first overlap ratio, a second overlap ratio, and a third overlap ratio are equal to one another, the first overlap ratio being a ratio of an area of the first pixel opening that is covered by the partition patterns to a total area of the first pixel opening, the second overlap ratio being a ratio of an area of the second pixel opening that is covered by the partition patterns to a total area of the second pixel opening, and the third overlap ratio being a ratio of an area of the third pixel opening that is covered by the partition patterns to a total area of the third pixel opening.

2. The display device of claim 1, wherein in a plan view, a first opening ratio, a second opening ratio, and a third opening ratio are equal to one another, the first opening ratio being a ratio of an area of the first pixel opening that is adjacent to a portion that is covered by the partition patterns to the total area of the first pixel opening, the second opening ratio being a ratio of an area of the second pixel opening that is adjacent to a portion that is covered by the partition patterns to the total area of the second pixel opening, and the third opening ratio being a ratio of an area of the third pixel opening that is adjacent to a portion that is covered by the partition patterns to the total area of the third pixel opening.

3. The display device of claim 1, further comprising fourth to sixth light emitting devices disposed in each of the unit pixel areas and emitting light of different colors, and wherein the partition patterns are spaced apart from the fourth to sixth light emitting devices in a plan view.

4. The display device of claim 3, wherein the first, second, and third light emitting devices are configured to selectively emit light, and the fourth, fifth, and sixth light emitting devices are configured to emit light in wide viewing angle mode, and the first, second, and third light emitting devices are configured to emit light, and light emission of the fourth, fifth, and sixth light emitting devices remain turned off in a narrow viewing angle mode.

5. The display device of claim 3, wherein the pixel defining layer further defines a fourth pixel opening positioned above a fourth pixel electrode of the fourth light emitting device, a fifth pixel opening positioned above a fifth pixel electrode of the fifth light emitting device, and a sixth pixel opening positioned above a portion of a sixth pixel electrode of the sixth light emitting device.

6. The display device of claim 5, wherein the first light emitting device and the fourth light emitting device emit light of the same color, the second light emitting device and the fifth light emitting device emit light of the same color, and the third light emitting device and the sixth light emitting device emit light of the same color.

7. The display device of claim 6, wherein in a plan view, the total area of the first pixel opening and a total area of the fourth pixel opening are different from each other.

8. The display device of claim 7, wherein in a plan view, the total area of the first pixel opening is larger than the total area of the fourth pixel opening.

9. The display device of claim 7, wherein in a plan view, the total area of the second pixel opening and a total area of the fifth pixel opening are equal to each other, and the total area of the third pixel opening and a total area of the sixth pixel opening are equal to each other.

10. The display device of claim 7, wherein in a plan view, the total area of the second pixel opening and a total area of the fifth pixel opening are different from each other, and the total area of the third pixel opening and a total area of the sixth pixel opening are equal to each other.

11. The display device of claim 7, wherein in a plan view, the total area of the second pixel opening and a total area of the fifth pixel opening are different from each other, and the total area of the third pixel opening and a total area of the sixth pixel opening are different from each other.

12. The display device of claim 1, wherein the partition patterns include at least one of black pigment, black dye, and molybdenum-tantalum oxide (MTO).

13. The display device of claim 1, further comprising a light transmission layer disposed between the partition patterns.

14. The display device of claim 1, wherein each of the partition patterns extends in a first direction and is spaced apart from one another along a second direction intersecting the first direction.

15. A display device comprising:

a substrate including unit pixel areas repeatedly arranged in a plan view;

light emitting devices disposed in each of the unit pixel areas on the substrate and emitting light of different colors;

a pixel defining layer defining pixel openings, each of the pixel openings positioned above a pixel electrode of each of the light emitting devices; and partition patterns disposed on the light emitting devices and partially covering the pixel openings in a plan view, wherein the pixel openings have the same overlap ratio, the overlap ratio being a ratio of an area of a pixel opening that is covered by the partition patterns to a total area of the pixel opening.

16. The display device of claim 15, wherein the pixel openings have the same opening ratio, the opening ratio being a ratio of an area of a pixel opening that is adjacent to a portion that is covered by the partition patterns to a total area of the pixel opening.

17. The display device of claim 15, wherein the light emitting devices are configured to selectively emit light in a wide viewing angle mode, and the light emitting devices are configured to emit light in a narrow viewing angle mode.

18. The display device of claim 15, wherein the partition patterns include at least one of black pigment, black dye, and molybdenum-tantalum oxide (MTO).

19. The display device of claim 15, further comprising a light transmission layer disposed between the partition patterns.

20. The display device of claim 15, wherein each of the partition patterns extends in a first direction and is spaced apart from one another along a second direction intersecting the first direction.

* * * * *